(12) United States Patent
Awaya et al.

(10) Patent No.: US 8,432,720 B2
(45) Date of Patent: Apr. 30, 2013

(54) NONVOLATILE SEMICONDUCTOR MEMORY DEVICE

(75) Inventors: Nobuyoshi Awaya, Osaka (JP); Yukio Tamai, Osaka (JP); Akihito Sawa, Tsukuba (JP)

(73) Assignee: Sharp Kabushiki Kaisha, Osaka (JP)

( * ) Notice: Subject to any disclaimer, the term of this patent is extended or adjusted under 35 U.S.C. 154(b) by 138 days.

(21) Appl. No.: 13/165,941

(22) Filed: Jun. 22, 2011

(65) Prior Publication Data

US 2011/0317472 A1   Dec. 29, 2011

(30) Foreign Application Priority Data

Jun. 29, 2010  (JP) ................................. 2010-148216

(51) Int. Cl.
*G11C 11/00*   (2006.01)

(52) U.S. Cl.
USPC .......................................... 365/148; 365/175

(58) Field of Classification Search .................. 365/148, 365/175; 257/350
See application file for complete search history.

(56) References Cited

U.S. PATENT DOCUMENTS

| | | | | |
|---|---|---|---|---|
| 6,720,621 B1 * | 4/2004 | Adan | ............................. | 257/350 |
| 7,539,040 B2 | 5/2009 | Tamai et al. | | |
| 8,023,312 B2 * | 9/2011 | Yamazaki et al. | ............. | 365/148 |
| 8,115,278 B2 * | 2/2012 | Isobe | ............................ | 257/536 |
| 2003/0142578 A1 | 7/2003 | Hsu et al. | | |
| 2004/0036109 A1 | 2/2004 | Inoue et al. | | |
| 2008/0089657 A1 | 4/2008 | Shibata et al. | | |
| 2008/0265235 A1 | 10/2008 | Kamigaichi et al. | | |
| 2009/0303772 A1 | 12/2009 | Rinerson et al. | | |

FOREIGN PATENT DOCUMENTS

| | | |
|---|---|---|
| JP | 2003-068984 | 3/2003 |
| JP | 2004-087069 | 3/2004 |
| JP | 2006-155846 | 6/2006 |
| JP | 2006-324447 | 11/2006 |
| JP | 2008-034641 | 2/2008 |
| JP | 2008-277543 | 11/2008 |
| JP | 4251576 | 1/2009 |

OTHER PUBLICATIONS

A. Sawa, "Resistive switching in transition metal oxides", Material Today, vol. 11, No. 6, p. 28-36 (2008).

* cited by examiner

*Primary Examiner* — Son Dinh
(74) *Attorney, Agent, or Firm* — Nixon & Vanderhye, P.C.

(57) ABSTRACT

A memory cell array having a 1R structure is composed of nonvolatile variable resistive elements each including a variable resistor formed of a metal oxide film whose resistance changes depending on an oxygen concentration in the film, and first and second electrodes sandwiching the variable resistor. The first electrode and the variable resistor form a rectifier junction through a rectifier junction layer composed of an oxide layer and a layer (oxygen depletion layer) of the metal oxide film having an oxygen concentration lower than a stoichiometric composition. The oxygen moves between the first electrode and the metal oxide film when a voltage is applied, and a thickness of the oxygen depletion layer changes, so that the resistance of the metal oxide film changes and the rectifying properties are provided. A thickness of the oxygen depletion layer is set to allow the variable resistive element to show the sufficient rectifying properties.

11 Claims, 30 Drawing Sheets

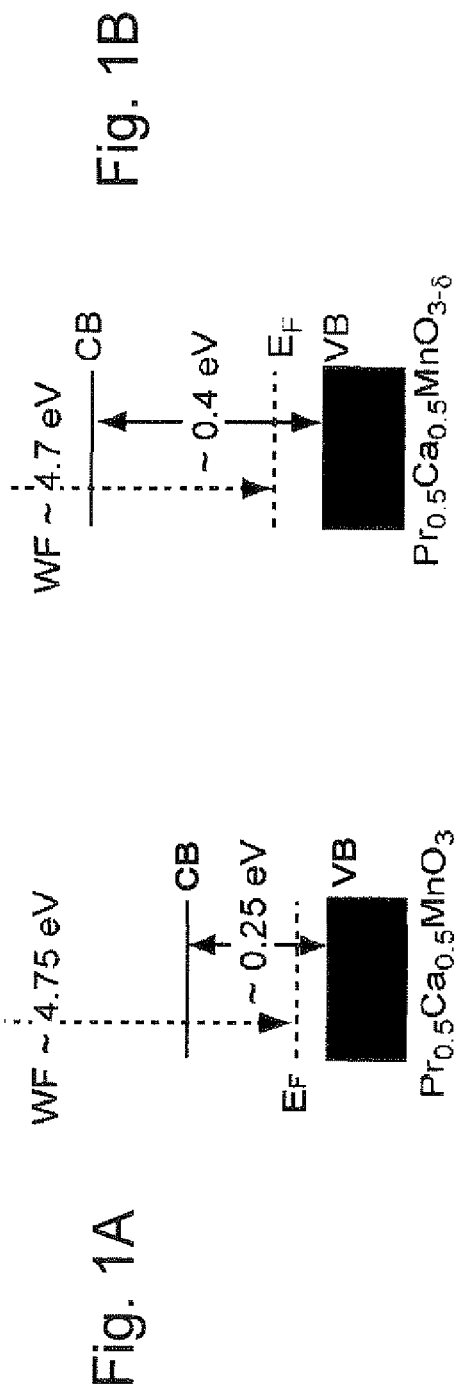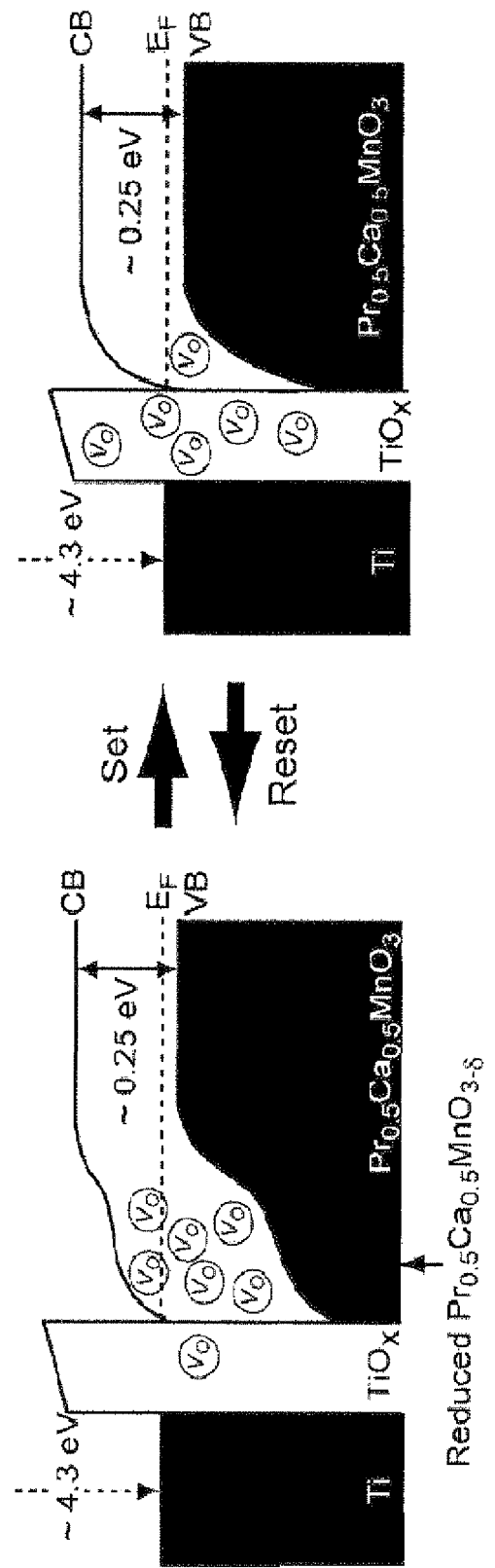

Lower Electrode Voltage

Lower Electrode Voltage

Fig. 6A
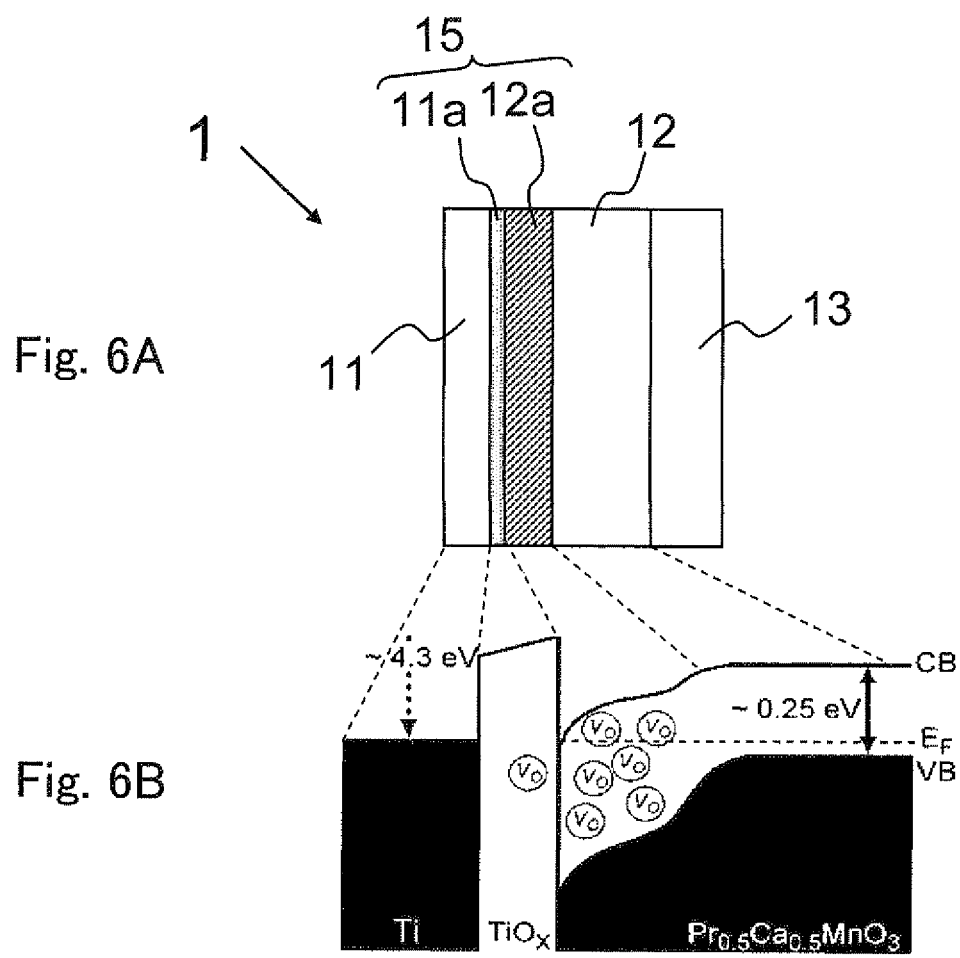
Fig. 6B
Fig. 6C
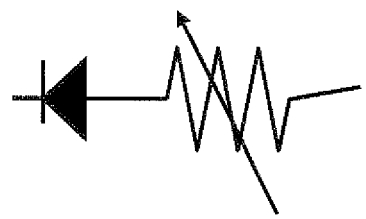

Fig. 14A
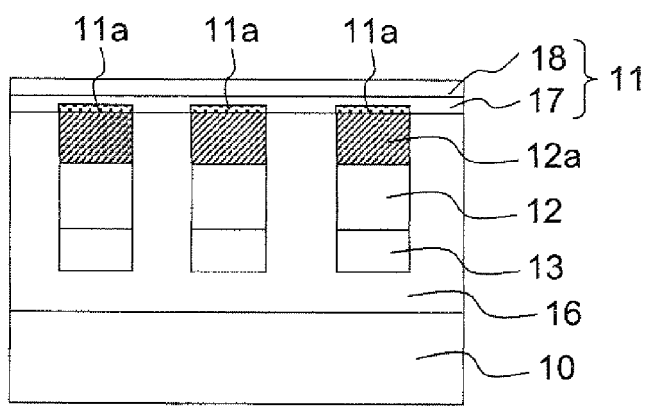
Fig. 14B
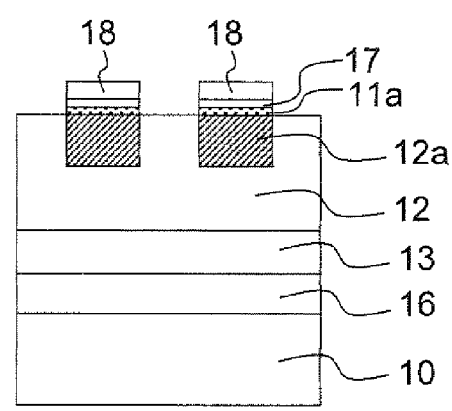
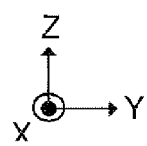
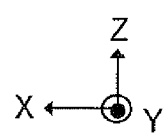

| | Applied Voltage | Applying Time of Voltage Pulse | Operating Current |
|---|---|---|---|
| SET Action (High Resistance →Low Resistance) | −4V | 5μs | 20μA |
| RESET Action (Low Resistance →High Resistance) | 3V | 10μs | 200nA |
| Reading Action 1 (Application of Forward Bias) | −1.5V | | 1μA (Low Resistance State) 10nA (High Resistance State) |
| Reading Action 2 (Application of Reverse Bias) | 1.5V | | 100nA (Low Resistance State) 10nA (High Resistance State) |

Fig. 15

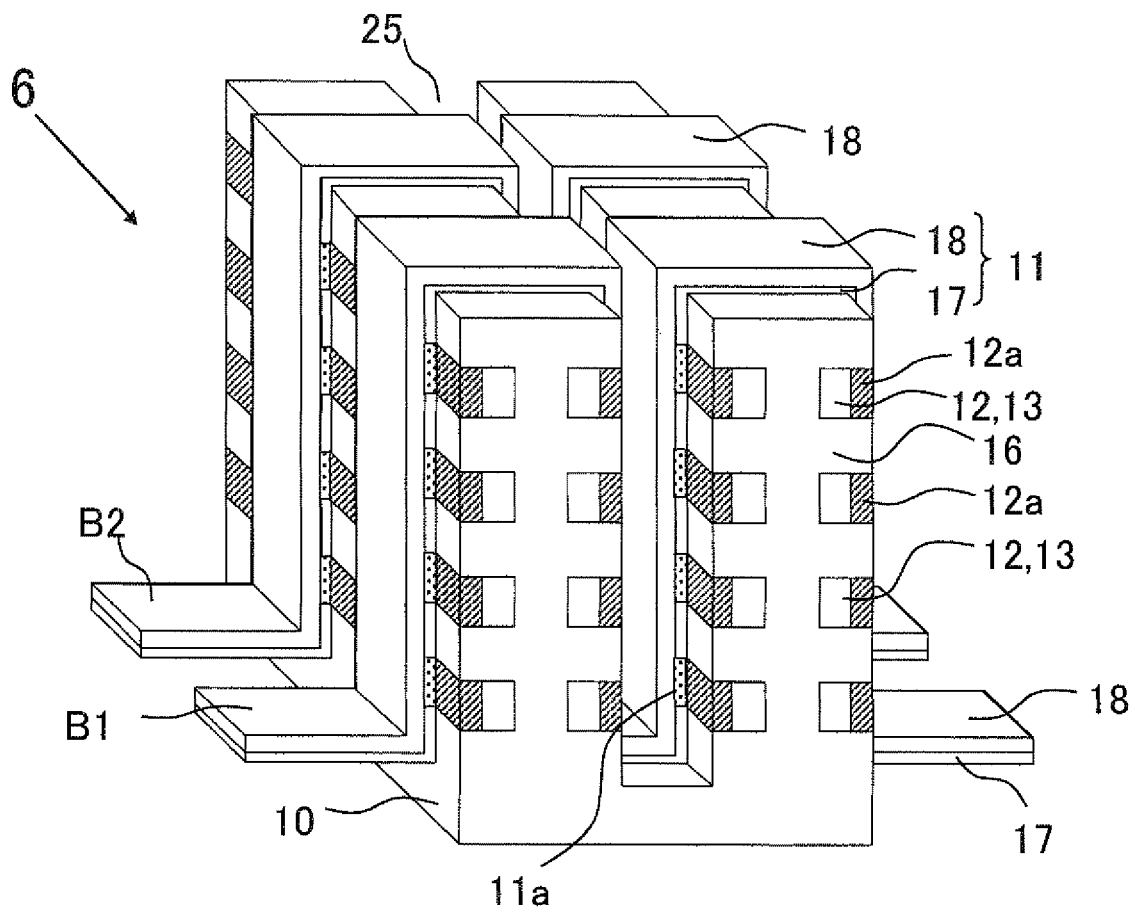
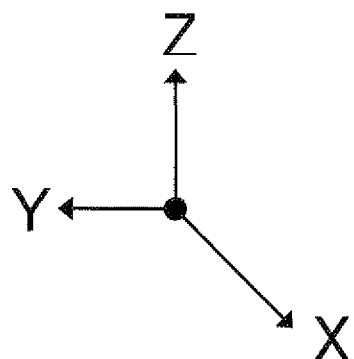
Fig. 23

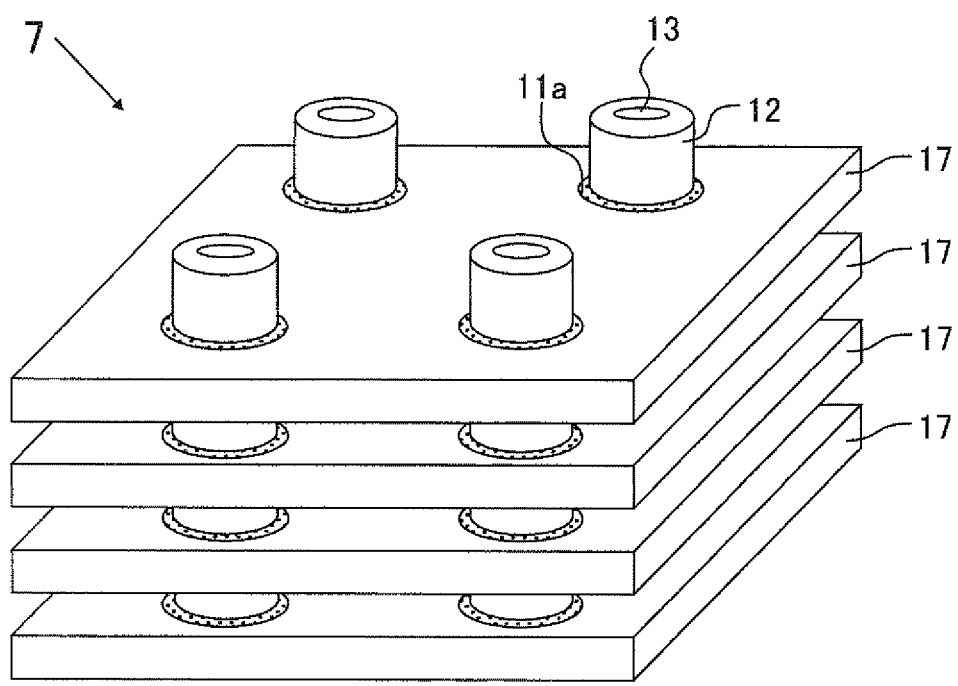
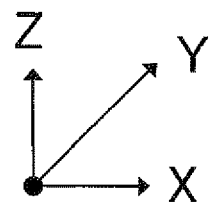
Fig. 26

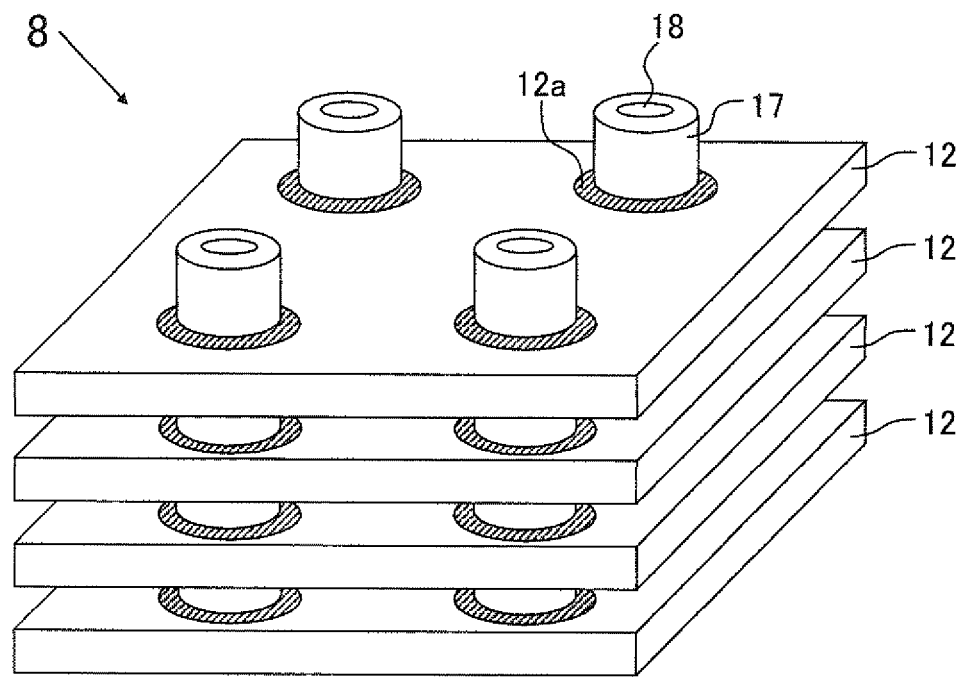
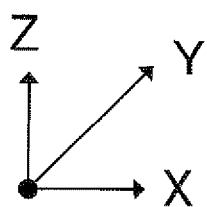
Fig. 29

NONVOLATILE SEMICONDUCTOR MEMORY DEVICE

CROSS REFERENCE TO RELATED APPLICATION

This Nonprovisional application claims priority under 35 U.S.C. §119(a) on Patent Application No. 2010-148216 filed in Japan on 29 Jun., 2010 the entire contents of which are hereby incorporated by reference.

BACKGROUND OF THE INVENTION

1. Field of the Invention

The present invention relates to a nonvolatile semiconductor memory device provided in such a manner that nonvolatile variable resistive elements each having a first electrode, a second electrode, and a variable resistor of a metal oxide film sandwiched by the electrodes are arranged in the form of a matrix, and more particularly it relates to a nonvolatile semiconductor memory device provided with a cross-point type memory cell array having a 1R structure in which the variable resistive element has rectifying properties.

2. Description of the Related Art

In tandem with the penetration of a mobile device such as a portable electric device, a flash memory has been widely used as a large-capacity and inexpensive nonvolatile memory which can hold stored data even when it is powered off. However, recently it has been found that the flash memory is limited in its miniaturization, so that nonvolatile memories such as a MRAM (Magnetoresistive Random Access Memory), a PCRAM (Phase Change Random Access Memory), a CBRAM (Conductive Bridging Random Access Memory), and a RRAM (Resistive Random Access Memory (Refer to A. Sawa, "Resistive switching in transition metal oxides", Material Today, Vol. 11, No. 6, p. 28-36 (2008) (hereinafter, referred to as the well-known document 1)) are increasingly being developed. Among these nonvolatile memories, the RRAM is a resistance change type nonvolatile memory using a change in deficient oxygen in a metal oxide, and it can implement a large resistance change and high-speed writing with a simple memory structure, so that it offers promising prospects as a highly integratable memory.

A unit element of the RRAM is composed of a two-terminal variable resistive element (resistance change element) in which a metal oxide film is sandwiched by two electrodes. Regarding the memory using the two-terminal variable resistive element, a cell structure and a memory array structure each having a simplest structure and suitable for increasing capacity are implemented in a cross-point type memory having a 1R structure in which a unit memory cell is only formed of a variable resistive element, as shown in Japanese Unexamined Patent Publication No. 2003-068984 (hereinafter, referred to as the well-known document 2). This structure can be provided in the RRAM having a large resistance change rate, but it is necessary to take measures against a leak current.

In order to eliminate the leak current in the 1R structure (having a variable resistive element only), a circuit is provided to prevent a voltage applied to the variable resistive element from fluctuating in view of load resistance on the side of a decoder when the voltage is applied to the variable resistive element according to Japanese Unexamined Patent Publication No. 2006-155846 (hereinafter, referred to as the well-known document 3). This is provided to take measures against the leak current in the 1R structure which is generated because the load resistance on the decoder side is not negligible as compared with resistance of the variable resistive element. That is, an externally applied voltage is divided based on a ratio between the resistance of the variable resistive element and the load resistance on the decoder side, so that a potential difference is generated between wirings connected to the variable resistive elements in a memory cell array, depending on a resistance value of each variable resistive element, which causes the leak current. In the configuration shown in the well-known document 3, the potential fluctuation between the wirings is prevented and the leak current is prevented by providing the circuit to detect the potential fluctuation between the wirings and to keep the voltage applied to the variable resistive elements constant.

However, the leak current can be prevented to a certain degree by this method, but in order to effectively prevent the leak current, it is necessary to reduce the number of the elements to the relatively small number in the memory cell array, so that area occupied by the decoder increases, and a memory chip size cannot be reduced.

Thus, to avoid the problem of the leak current, a cell structure called a 1T1R or 1D1R in which a current limit element such as a transistor or a two-terminal rectifying element (diode or varistor) is added to the unit memory cell has been developed as disclosed in Japanese Unexamined Patent Publication No. 2004-087069 (hereinafter, referred to as the well-known document 4). The 1T1R structure can control an amount and a direction of a current flowing in the variable resistive element in a 1R part and it is superior in controllability, but it is large in area and a multilayer structure cannot be easily provided, so that its memory capacity is limited by a chip area and a design rule.

Meanwhile, the 1D1R structure is provided such that a minimum area unit element is formed in a cross-point structure by optimizing the process, and multilayer structure can be provided, so that it is suitable for increasing capacity. The memory cell using the 1D1R structure can be combined with the matrix-shaped array structure as shown in the well-known document 2. However, to form the unit memory cell by connecting the variable resistive element and the two-terminal rectifying element in series, it is necessary to laminate a pn junction or Shottky junction and the variable resistive element, so that production steps become complicated.

In addition, in most cases, the variable resistive element in the RRAM shifts between the high resistance state and the low resistance state when different voltages having positive and negative polarities are applied across its electrodes. In order to satisfy the characteristics of the resistance change element and rectifying properties in the cross-point memory, it is required for the resistance to largely differ by the different polarities such as the positive voltage and the negative voltage, and for the resistance state to shift due to the application of the voltages having different polarities. Therefore, it is difficult to optimize characteristic balance of both variable resistive element and the rectifying element to obtain a preferable memory action.

Meanwhile, as for the metal oxide film having the perovskite structure such as $Pr_{1-x}Ca_xMnO_3$ or $Sm_{1-x}Ca_xMnO_3$, the fact that when one side of the film is formed into Shottky junction, characteristics satisfying both rectifying properties and properties of the variable resistive element can be obtained is disclosed in the well-known document 1. The device disclosed in Japanese Patent No. 4251576 uses the above characteristics and has an extremely simple structure in which a metal oxide film serving as the variable resistor is sandwiched by metal electrodes, and when the metal oxide film forms the Shottky junction with any one of the two electrodes, the same characteristics as that of the cross-point memory having the 1D1R structure disclosed in the well-known document 4 can be obtained with the cross-point memory having the 1R structure and a memory array in which a leakage current is prevented can be realized.

However, even in the similar structure, the rectifying properties are hardly generated and the above characteristics cannot be obtained in some cases, so that to satisfy constant material properties and a structural condition is considered necessary in order to obtain desired characteristics, but the condition have not been known yet.

SUMMARY OF THE INVENTION

Thus, it is an object of the present invention to reveal a condition for a variable resistive element to satisfy both rectifying properties and characteristics of the variable resistive element, and to provide a semiconductor memory device having a cross-point memory of a 1R structure capable of preventing a leak current and a method for controlling a programming action of the device, based on the above condition.

First, a description will be made in detail of a material property base serving as a promise of the present invention.

While the resistance change element (variable resistive element) called the RRAM changes its resistance by controlling a concentration of deficit oxide in a metal oxide film serving as a variable resistor in general, as shown in the well-known document 1, it is classified to the one in which the resistance change is generated in a metal oxide having a perovskite structure represented by $Pr_{1-x}Ca_xMnO_3$ (PCMO) when oxygen moves through an interface between the metal oxide and an electrode, and an oxygen concentration uniformly changes in the whole electrode interface, and the one in which the resistance change is generated mainly in a binary oxide of transition metal when deficit is generated in a part of the metal oxide in the form of a filament. The present invention uses the former resistance change material as a variable resistor in which the oxygen concentration uniformly changes in the whole electrode interface, and the resistance change is generated. The resistance change material includes a Ti or Mn oxide film having the perovskite structure such as $SrTiO_3$, the above PCMO, or $Sm_{1-x}Ca_xMnO_3$.

FIGS. 1A to 1D show a principle of the resistance change of $Pr_{1-x}Ca_xMnO_3$ (PCMO) as one example. The PCMO is a p-type material which shows electric conduction by holes, and as shown in FIGS. 1A and 1B, when an oxygen concentration is lower than a stoichiometric composition, a bandgap increases and electric resistance increases. In addition, when metal having weak electron affinity such as Ti or Al is provided as one electrode, oxygen moves from PCMO to the metal, a metal oxide layer is formed around the interface between the metal and the PCMO on the side of the metal, and a layer having a low oxygen concentration due to an increase of deficit oxygen Vo is formed around the interface on the side of the PCMO. Here, when a positive or negative electric field is applied, as shown in FIGS. 1C and 1D, oxygen (deficit oxygen) moves between the PCMO and the metal oxide layer depending on the direction of the electric field, and it is considered that the resistance changes due to a change in band structure of the PCMO.

FIG. 2 shows a relationship (V–‖I‖ characteristics) between an applied voltage and an absolute value of a current flowing due to the voltage application in a variable resistive element composed of a lower electrode formed of $SrRuO_3$ (SRO) having high conductivity, an upper electrode formed of Ti, and a variable resistor formed of $Pr_{1-x}Ca_xMnO_3$ (PCMO) sandwiched between the electrodes. FIG. 3 shows a structure of the element 1. A size of the Ti electrode 11 functioning as the upper electrode is 100 μm×100 μm. In FIG. 2, a horizontal axis shows a voltage applied to the lower electrode 13 based on a potential of the upper electrode 11. Just after the upper electrode Ti has been deposited on the PCMO 12 (a curve A in FIG. 2), junction shows ohmic characteristics. After that, when a voltage is swept in the lower electrode 13 toward minus based on the upper electrode 11 (a curve B in FIG. 2), the element 1 shifts to the high resistance state at a certain voltage or more. This first sweeping is referred to as the "forming".

Then, when a voltage is swept in the lower electrode 13 toward the plus based on the upper electrode 11 (a curve C in FIG. 2), the element 1 shifts from the high resistance state to the low resistance state at a voltage of a certain threshold value or more, and when the voltage is further swept toward the minus (a curve D in FIG. 2), the element 1 shifts from the low resistance state to the high resistance state at the voltage of the certain threshold value or more, so that the resistance state is switched. In each of the high resistance state and the low resistance state, a large current flows when the positive bias is applied toward the lower electrode 13, while a smaller current flows when the negative bias is applied to the lower electrode, which shows rectifying properties.

Meanwhile, in a case where $TiO_2$ is inserted between the upper electrode Ti and the PCMO, as shown by a curve E in FIG. 2, the resistance state is not switched even when the voltage is applied in the similar manner in the above forming. Similarly, in a case where $TiO_2$ is inserted between the upper electrode Ti and the $LaMnO_3$ (LMO) (a curve F in FIG. 2), the resistance state is not also switched.

The above result shows that oxygen in the PCMO is extracted toward the Ti side by the forming, and a layer having an oxygen concentration lower than a stoichiometric composition is formed, so that the PCMO becomes the high resistance state and its resistance state can be switched. At this time, the oxygen moved from the PCMO to the Ti binds to Ti at an interface, whereby a TiOx film is formed. Meanwhile, in the case $TiO_2$ is inserted between the Ti and the PCMO, $TiO_2$ does not extract the oxygen in the PCMO, so that the resistance state is not switched.

Then, in an element formed in such a manner that the lower electrode 13 is formed of $LaSrMnO_3$ (LSMO) having high conductivity, the upper electrode 11 is formed of Ti, and the variable resistor 12 is formed of $Sm_{1-x}Ca_xMnO_3$ (SCMO) on the LSMO so as to be inserted between the upper electrode and the lower electrode, FIGS. 4A and 4B show a change in current voltage characteristics in a case where a thickness of the inserted layer is increased. A structure of the element is the same as that shown in FIG. 2. FIG. 4A shows voltage current characteristics (VI characteristics) in the case where a voltage is applied to the lower electrode based on the upper electrode after the same process as the forming in FIG. 2, and FIG. 4B shows a relationship between an applied voltage and an absolute value of a current flowing due to the voltage application (V–‖I‖ characteristics).

As shown in FIGS. 4A and 4B, when the Ti electrode is directly formed on the LSMO (n=0), ohmic junction characteristics are shown, and the resistance state is not switched. When a unit film thickness (film thickness ratio to 0.4 nm) n of the SCMO is 1, bipolar switching characteristics are shown as follows; the resistance state shifts when voltages having different polarities are applied, but there is no big difference in current amounts flowing when the voltages having different polarities are applied, and the rectifying properties are not shown. Meanwhile, when the film thickness ratio n of the SCMO exceeds 5 (=2 nm), there is a large difference in current amounts flowing depending on the polarities of the voltage application, and the rectifying properties are shown.

Thus, it has been confirmed that the above resistance switching characteristics is generated even when a metal oxide film other than the Mn oxide is used as the variable resistor, and a metal which is likely to bond to oxygen such as Al is used as the upper electrode instead of Ti. FIG. 5 shows voltage current characteristics after the forming of an element in which $La_{1.65}Sr_{0.35}CuO_4$ formed on a (001) surface of LaSrAlO$_4$ (LSAO) serves as the lower electrode, $La_2CuO_4$ serves as the variable resistor, and Ti or Al serves as the upper electrode. In the case where Ti is used, and in the case where Al is used as the upper electrode, it is found that the resistance switching characteristics are shown.

As described above, in order to provide the variable resistive element having the rectifying properties, it is found that the metal oxide film 12 having the perovskite structure and serving as the variable resistor needs to have one end being in contact with the metal 11 to form rectifier junction between them, and the other end being in contact with the material (such as Pt) 13 to form ohmic junction as shown in FIG. 6A, and needs to have a band structure as shown in FIG. 6B. That is, the following conditions are to be satisfied.

(1) At the interface between the metal oxide film 12 serving as the variable resistor and having the perovskite structure, and the upper electrode (first electrode) 11 or the lower electrode (second electrode) 13 (the upper electrode 11 in FIG. 6), the layer (oxygen depletion layer 12a) having the oxygen concentration of the metal oxide film lower than the stoichiometric composition is to be formed on the side of the metal oxide film of the interface.

(2) The junction at the interface between the metal oxide film 12 having the perovskite structure and the upper electrode or the lower electrode having the oxygen depletion layer is to show the rectifier junction such as the Shottky junction or the hetero junction.

(3) The oxygen depletion layer is to have the thickness so that the rectifying properties can be shown even when the depletion layer widens when the reverse voltage of the rectifier junction is applied. When the film thickness of the metal oxide film 12 is small, the depletion layer cannot widen when the reverse voltage is applied, and the depletion layer cannot provide enough rectifying properties, so that the rectifying properties are not provided as shown in FIG. 4.

When the above conditions (1) to (3) are satisfied, the oxygen of the metal oxide film having the perovskite structure in the variable resistor moves between the electrode and the variable resistor when the voltage of the threshold value or more is applied, so that the resistance state of the element shifts between the high resistance state and the low resistance state. That is, the oxygen moves from the oxygen depletion layer of the variable resistor to the electrode when a voltage of a second threshold value or more is applied, and the oxygen depletion layer 12a widens in the metal oxide film 12 having the perovskite structure, so that the variable resistive element shifts to the high resistance state in FIGS. 6A and 6B. At this time, the oxide layer (insulation film) 11a having a film thickness of 1 nm is formed at the interface between the electrode 11 and the oxygen depletion layer 12a on the side of the electrode. Meanwhile, the oxygen moves from the oxide layer 11a to the variable resistor 12 when a voltage of a first threshold value or more is applied, and the oxygen depletion layer 12a narrows in the metal oxide film having the perovskite structure, so that the variable resistive element moves to the low resistance state. A rectifier junction layer 15 is composed of the oxide layer 11a and the oxygen depletion layer 12a, and the variable resistor 12 and the electrode 11 form the rectifier junction with the rectifier junction layer 15 interposed therebetween, so that the oxygen depletion layer 12a widens and the current is not likely flow when the reverse bias is applied, and the oxygen depletion layer 12a narrows and a large current flows when the forward bias is applied. As a result, the current voltage characteristics are provided as shown by the curves C and D in FIG. 2, and the characteristics are provided as shown by an equivalent circuit in FIG. 6C in which a rectifying element and the variable resistive element are connected in series.

Therefore, by using the element which satisfies the above condition, the nonvolatile semiconductor memory device can be easily formed while the cross-point memory configuration having the simplest 1R structure is employed, the leak current is prevented, high capacity is implemented, and high-speed access is realized.

Thus, as a first characteristic, a nonvolatile semiconductor memory device according to the present invention includes a memory cell array provided in such a manner that nonvolatile variable resistive elements each having a variable resistor formed of a metal oxide film having resistance changing depending on an oxygen concentration in the film, an insulation film having contact with the variable resistor, a first electrode connected to the variable resistor through the insulation film, and a second electrode directly connected to the variable resistor without passing through the insulation film, are arranged in at least row and column directions in the form of a matrix, in which the variable resistive element is provided in such a manner that an oxygen depletion layer having an oxygen concentration lower than a stoichiometric composition, in the metal oxide film serving as the variable resistor, is formed at an interface between the variable resistor and the first electrode on the side of the variable resistor, connection between the first electrode and the variable resistor is rectifier junction with the insulation film interposed therebetween, connection between the second electrode and the variable resistor is ohmic junction, oxygen reversibly moves between the insulation film and the variable resistor when a voltage having an absolute value of a first threshold value or more is applied across the first and second electrodes in a forward direction of the rectifier junction, the oxygen depletion layer narrows, and resistance characteristics of the variable resistive element shifts to a low resistance state, oxygen reversibly moves between the insulation film and the variable resistor when a voltage having an absolute value of a second threshold value or more is applied across the first and second electrodes in a reverse direction of the rectifier junction, the oxygen depletion layer widens, and the resistance characteristics of the variable resistive element shifts to a high resistance state, and each of the resistance characteristics of the low resistance state and the resistance characteristics of the high resistance state has asymmetric characteristics such that when a predetermined voltage is applied across the first and second electrodes, a current amount flowing in the variable resistive element is large in the case where the voltage is applied in the forward direction of the rectifier junction, and small in the case where the voltage is applied in the reverse direction of the rectifier junction.

In addition to the first characteristic, as a second characteristics, in the nonvolatile semiconductor memory device according to the present invention, the memory cell array is a three-dimensional memory cell array provided in such a manner that the variable resistive elements are arranged in the row direction, the column direction, and a third direction perpendicular to the row direction and the column direction in the form of a three-dimensional matrix.

In addition to the second characteristic, as a third characteristics, in the nonvolatile semiconductor memory device according to the present invention, the three-dimensional memory cell array is provided in such a manner that any one of the first and second electrodes has a laminated structure formed of a plurality of layers separated with an interlayer insulation film interposed therebetween, a plurality of through holes penetrating the laminated structure are formed, the other electrode of the first and second electrodes is formed so as to cover an inner peripheral wall surface of each of the through holes, and the variable resistor and the insulation film both having an annular shape are interposed between the first and second electrodes to connect the first and second electrodes.

In addition to the first to third characteristics, as a fourth characteristic, in the nonvolatile semiconductor memory device according to the present invention, the insulation film is an oxide film of a metal functioning as the first electrode.

In addition to the first to fourth characteristics, as a fifth characteristic, in the nonvolatile semiconductor memory device according to the present invention, the metal oxide film functioning as the variable resistor includes a metal oxide having a perovskite structure.

In addition to the fifth characteristic, as a sixth characteristic, in the nonvolatile semiconductor memory device according to the present invention, the metal oxide film functioning as the variable resistor includes an oxide having a perovskite structure expressed by any one general formula ($0 \leq X \leq 1$, $0 \leq Z < 1$) among $Pr_{1-X}Ca_X[Mn_{1-Z}M_Z]O_3$ (wherein M is an element selected from Ta, Ti, Cu, Cr, Co, Fe, Ni, and Ga), $Sm_{1-X}Ca_XMnO_3$, $La_{1-X}AE_XMnO_3$ (wherein AE is divalent alkali earth metal selected from Ca, Sr, Pb, and Ba), $RE_{1-X}Sr_XMnO_3$ (wherein RE is trivalent rare earth element selected from Sm, La, Pr, Nd, Gd, and Dy), $La_{1-X}Co_X[Mn_{1-Z}Co_Z]O_3$, $Gd_{1-X}Ca_XMnO_3$, and $Nd_{1-X}Gd_XMnO_3$.

In addition to the first to sixth characteristics, as a seventh characteristic, in the nonvolatile semiconductor memory device according to the present invention, a thickness of the oxygen depletion layer is 2 nm or more when the variable resistive element is in the high resistance state.

In addition to the first to seventh characteristics, as an eighth characteristic, in the nonvolatile semiconductor memory device according to the present invention, the second electrode is a metal oxide film functioning as the variable resistor, and its oxygen concentration is fixed.

In addition to the first to eighth characteristics, as a ninth characteristic, in the nonvolatile semiconductor memory device according to the present invention, among a first erasing means for selecting the plurality of variable resistive elements belonging to one or more columns, or the plurality of variable resistive elements belonging to one or more rows, and simultaneously applying the voltage of the first threshold value or more across the first and second electrodes in the forward direction of the rectifier junction to shift the resistance characteristics of the variable resistive elements to the low resistance state, a first programming means for simultaneously applying the voltage of the second threshold value or more to the variable resistive element to be changed to the high resistance state, and a voltage less than the second threshold value to the variable resistive element to be kept in the low resistance state, in the reverse direction of the rectifier junction, across the first and second electrodes, among the plurality of variable resistive elements belonging to one selected row or one selected column, a second erasing means for selecting the plurality of variable resistive elements belonging to one or more columns, or the plurality of variable resistive elements belonging to one or more rows, and simultaneously applying the voltage of the second threshold value or more across the first and second electrodes in the reverse direction of the rectifier junction to shift the resistance characteristics of the variable resistive elements to the high resistance state, and a second programming means for simultaneously applying the voltage of the first threshold value or more to the variable resistive element to be changed to the low resistance state, and a voltage less than the first threshold value to the variable resistive element to be kept in the high resistance state in the forward direction of the rectifier junction, across the first and second electrodes, among the plurality of variable resistive elements belonging to one selected row or one selected column, at least one of combination of the first erasing means and the first programming means, and combination of the second erasing means and the second programming means is provided.

In addition to the ninth characteristic, as a tenth characteristic, in the nonvolatile semiconductor memory device according to the present invention, the memory cell array is divided into at least two memory regions, in a first memory region, the resistance state of the variable resistive element is written by the combination of the first erasing means and the first programming means, and in a second memory region, the resistance state of the variable resistive element is written by the combination of the second erasing means and the second programming means.

In addition to the tenth characteristic, as an eleventh characteristic, in the nonvolatile semiconductor memory device according to the present invention, the first memory region is used as a data storage region, and the second memory region is used as a program storage region.

Therefore, according to the present invention, in the cross-point memory having the simple 1R structure, the memory array in which the leak current is prevented from being generated can be realized without separately providing a rectifier element, and the nonvolatile memory in which capacity is high, cost is low, and high-speed access is implemented can be provided.

BRIEF DESCRIPTION OF THE DRAWINGS

FIGS. 1A to 1D are views to explain a principle of a resistance change in a metal oxide having a perovskite structure;

FIGS. 6A to 6C are views showing an element structure, a band structure, and an equivalent circuit of the variable resistive element according to the present invention;

FIGS. 14A and 14B are cross-sectional views showing the element structure in the memory cell array having the variable resistive element according to the present invention in the other example;

FIG. 15 is a table showing a voltage application condition and an operating current in a writing action of the variable resistive element according to the present invention;

FIG. 23 is a birds-eye view showing another example of an element structure of a three-dimensional memory cell array including the variable resistive element according to the present invention;

FIG. 26 is a birds-eye view showing another example of an element structure of a three-dimensional memory cell array including the variable resistive element according to the present invention;

FIG. 29 is a birds-eye view showing another example of an element structure of a three-dimensional memory cell array including the variable resistive element according to the present invention.

DESCRIPTION OF THE PREFERRED EMBODIMENTS

Hereinafter, a description will be made of an element structure of a nonvolatile semiconductor memory device according to the present invention, a method for producing and a method for operating the same.

First Embodiment

Figure 2:
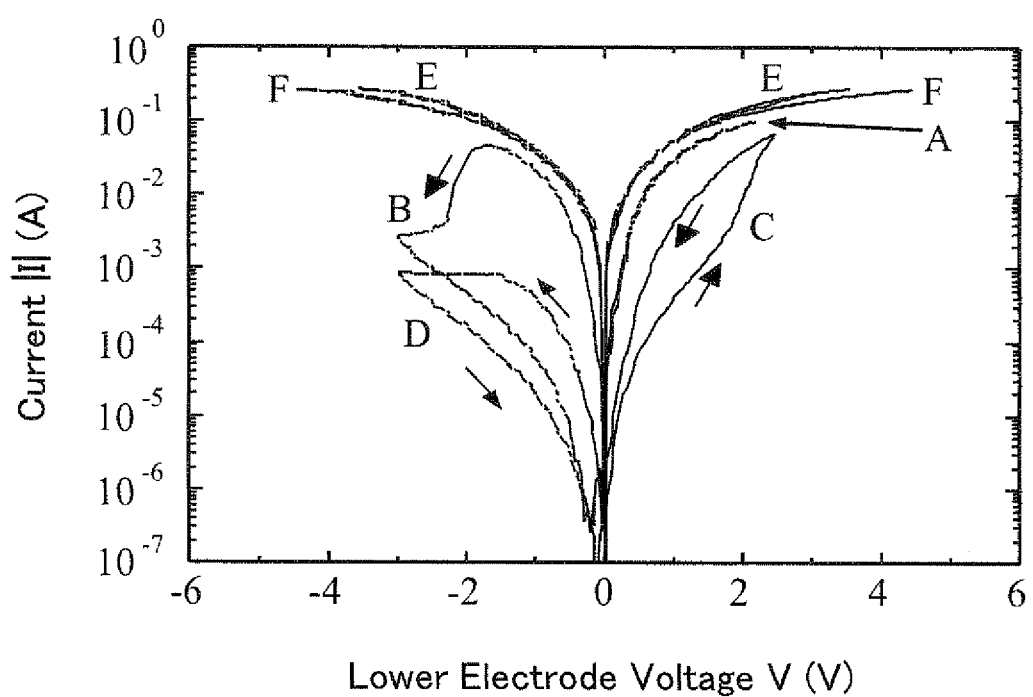
FIG. 2 is a view showing resistance change characteristics of a variable resistive element according to the present invention.
Figure 3:
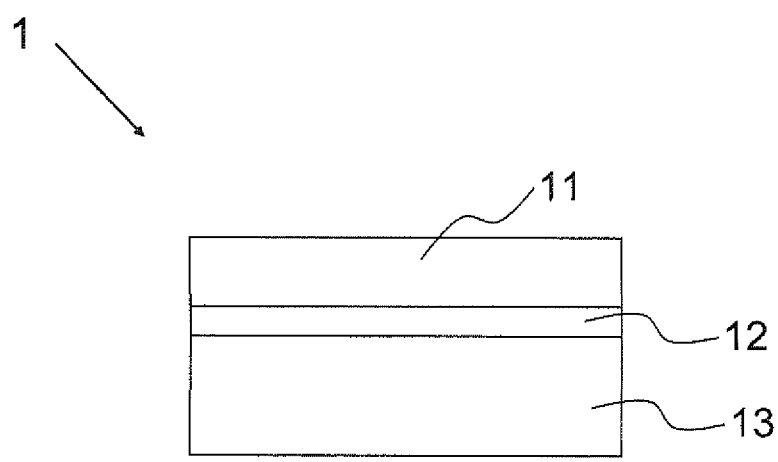
FIG. 3 is a cross-sectional view showing one example of an element structure of the variable resistive element according to the present invention.
Figure 4A:
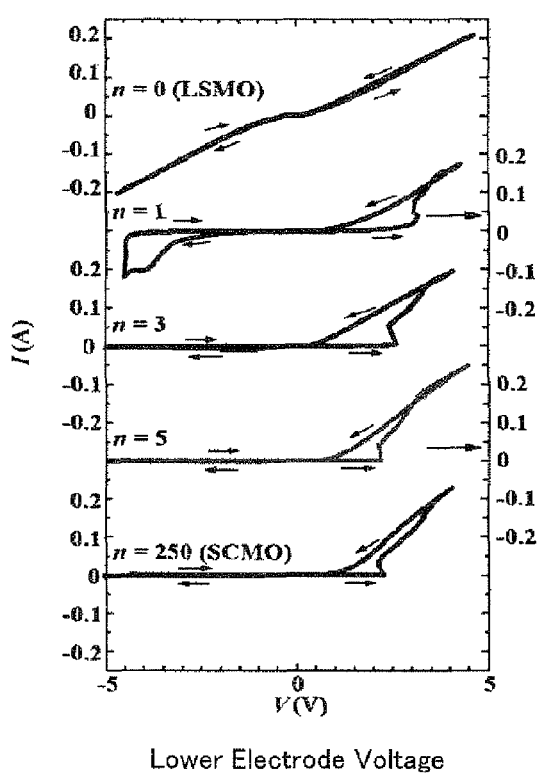
FIGS. 4A and 4B are IV characteristic diagrams showing dependency of the resistance change characteristics of the variable resistive element according to the present invention on a film thickness of a variable resistor.
Figure 4B:
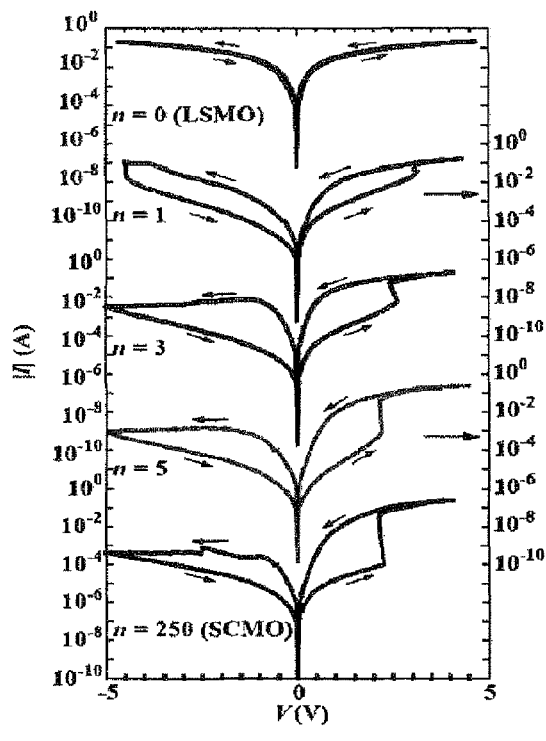
Figure 5:
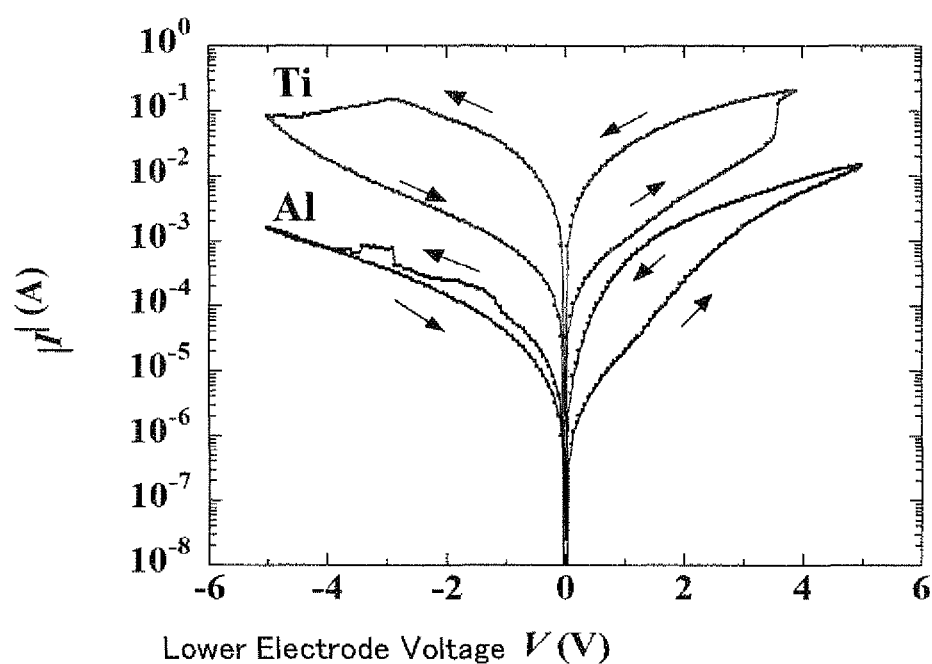
FIG. 5 is another IV characteristic diagram showing resistance change characteristics of the variable resistive element according to the present invention.
Figure 7:
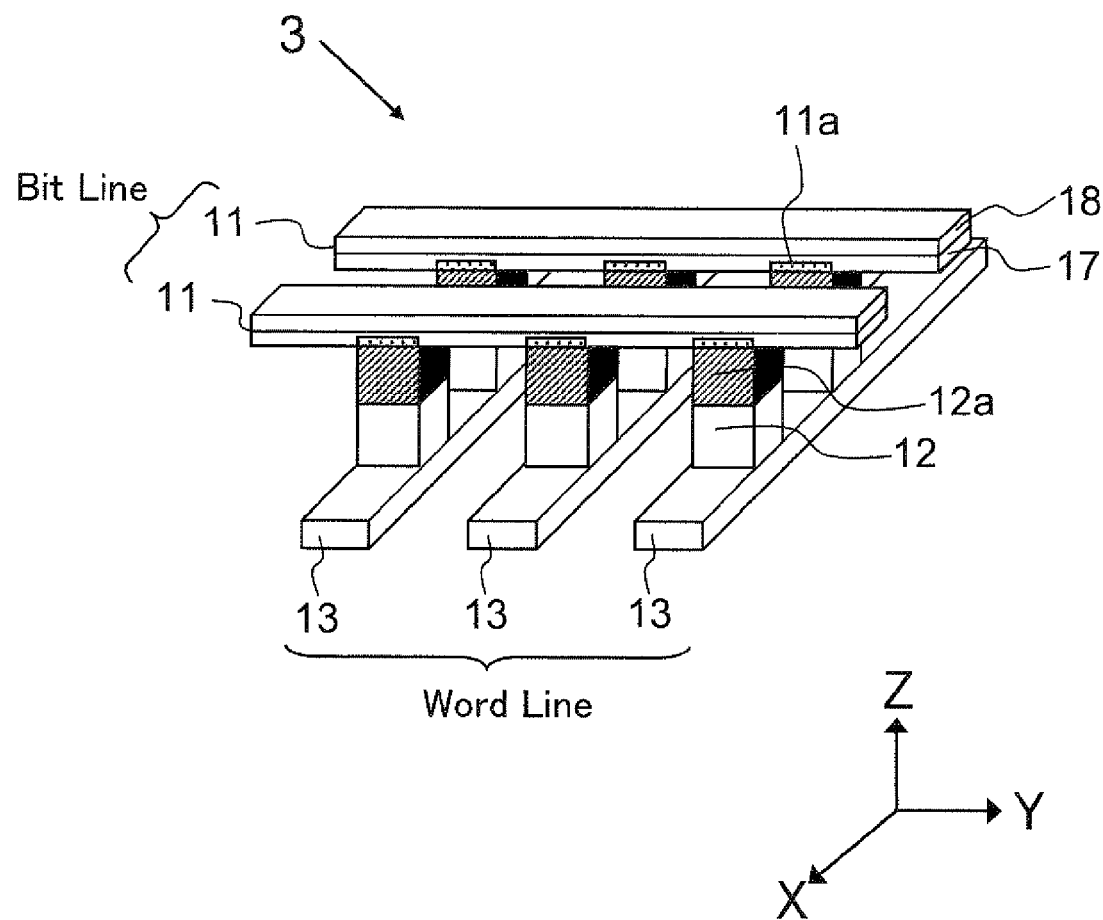
FIG. 7 is a birds-eye view showing an element structure of a memory cell array including the variable resistive element according to the present invention.

FIG. 7 is a birds-eye view schematically showing a device structure of a memory cell array 3 used in a nonvolatile semiconductor memory device according to one embodiment of the present invention (hereinafter, referred to as the "device of the present invention" occasionally). In addition, a substantial part is overdrawn for convenience of the description in the following drawings, so that a dimensional ratio of each part of an element does not always coincide with an actual dimensional ratio in some cases.

Figure 8A:
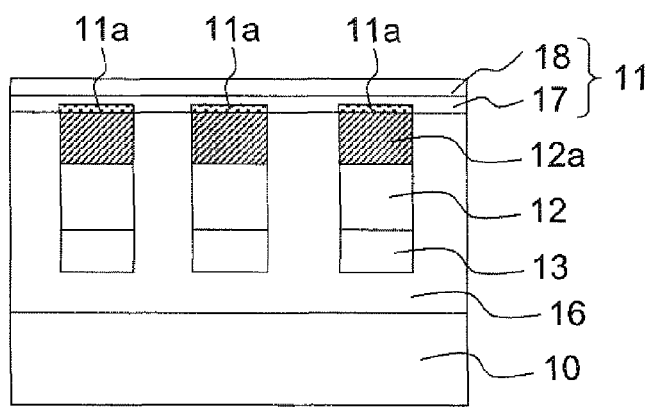
FIGS. 8A and 8B are cross-sectional views showing the element structure of the memory cell array including the variable resistive element according to the present invention.
Figure 8B:
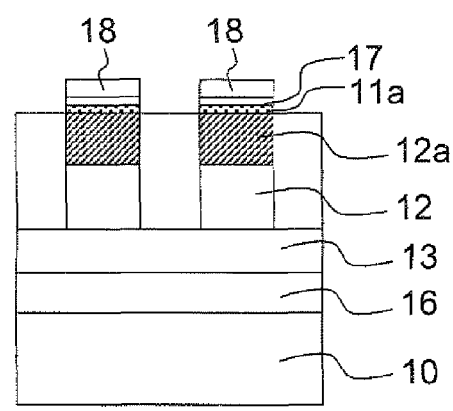

As shown in FIG. 7, the memory cell array 3 has a crosspoint structure in which the above-described variable resistive elements 1 each including a lower electrode (second electrode) 13 formed on an interlayer insulation film 16 (not shown) formed on a Si substrate 10 (not shown), an upper electrode (first electrode) 11 composed of electrodes 17 and 18, and a metal oxide film 12 (12a) having a perovskite structure, are arranged in row and column directions in the form of a matrix. The upper electrode 11 extends in a column direction (Y direction) to function as a bit line, and the lower electrode 13 extends in a row direction (X direction) to function as a word line. Thus, the island-shaped metal oxide films 12 (12a) are provided in regions where the bit lines and the word lines intersect and sandwiched by the upper electrodes (bit lines) 11 and the lower electrodes (word lines) 13, whereby the variable resistive elements 1 are formed. In addition, while FIG. 7 shows the memory cell array composed of six memory cells specified by the two bit lines and the three word lines, in order to prevent the drawing from becoming complicated, the present invention is not limited to this configuration. The present invention is practicable regardless of the number of the word lines, bit lines, and the memory cells in the array, and as the number of the memory cells increases in the array, that is, as capacity of the memory cell array increases, the present invention becomes more effective. FIG. 8A shows a structural cross-sectional view taken along a Y-Z cross-section containing the bit lines (upper electrodes 11) in FIG. 7, and FIG. 8B shows a structural cross-sectional view taken along a Z-X cross-section containing the word lines (lower electrodes 13) in FIG. 7.

The metal oxide film 12 partially has the oxygen depletion layer 12a having an oxygen concentration lower than a stoichiometric composition, and the oxygen depletion layer 12a is in contact with the upper electrode 11. The metal oxide film 12 (12a) is, for example, composed of PCMO ($Pr_{1-x}Ca_xMnO_3$) or SCMO ($Sm_{1-x}Ca_xMnO_3$) serving as a p-type metal oxide having a perovskite structure. The lower electrode 13 is a metal such as Pt which is in ohmic contact with PCMO or SCMO.

As for the upper electrode 11 composed of the electrodes 17 and 18, the electrode 17 is in contact with the metal oxide film 12a and it is made of a metal which is more likely to bind to oxygen than the metal oxide film 12, and has a small work function so as to be able to form Shottky junction with the p-type oxide having the perovskite structure. For example, Ti or Al is preferably used. As another preferable example, an oxide of Ta, Hf, Zr, or La is used. In this embodiment, Al is used. A film thickness of the electrode 17 is preferably 10 nm or less. Thus, when the metal oxide film 12 reacts with the electrode 17, oxygen of the metal oxide film 12 is extracted and moved into the electrode 17, whereby the oxygen concentration of the metal oxide film 12a becomes lower than the stoichiometric composition, and an oxide layer 11a of the electrode 17 is formed at an interface between the metal oxide film 12a and electrode 17 on the side of the electrode 17. That is, the metal oxide film 12a serves as the above-described oxygen depletion layer, and the oxide layer 11a serves as the above-described insulation film which is in contact with the variable resistor, so that rectifier junction is implemented by the oxide layer 11a and the oxygen depletion layer 12a. Meanwhile, the electrode 18 is preferably formed of a metal having low reactivity such as Pt or TiN.

A film thickness of the oxygen depletion layer 12a is thick enough to be able to show rectifying properties even when the depletion layer widens due to application of a reverse voltage of the above rectifier junction and a resistance state of the variable resistive element becomes a high resistance state. The thickness of the oxygen depletion layer 12a required to show the rectifying properties is preferably 2 nm or more while depending on the materials of the metal oxide film 12 and the upper electrode.

The upper electrode (bit line) 11 selects a row-direction position of the memory cell targeted for a memory action (such as programming, erasing, or reading action as will be described below), and is connected to a column decoder (not shown) to apply a voltage required for the memory action to each word line. In addition, the lower electrode (word line) 13 selects a column-direction position of the memory cell targeted for the memory action, and is connected to a row decoder (not shown) to apply a voltage required for the memory action to each bit line. In addition, a voltage supply circuit to supply the voltage required for the memory action to the bit line and the word line, a readout circuit to read the resistance state of the selected memory cell through the bit line and the word line, and a control circuit are provided, whereby the device of the present invention is constituted. As for the row and column decoders, the voltage supply circuit, the readout circuit, and the control circuit, the various kinds of well-known configurations used in the general nonvolatile semiconductor memory device are available for them, so that their descriptions are omitted.

Figure 9A:
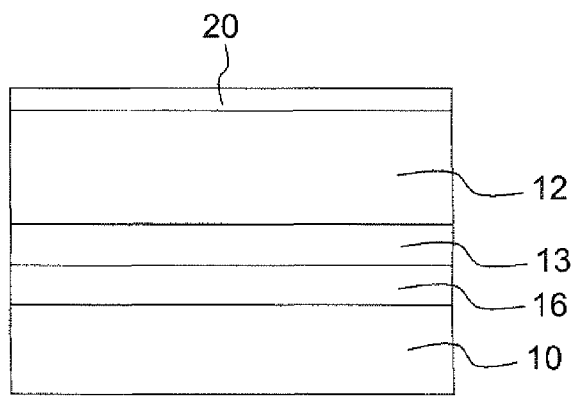
FIGS. 9A and 9B are structural cross-sectional views showing a production step of the memory cell array including the variable resistive element according to the present invention.
Figure 9B:
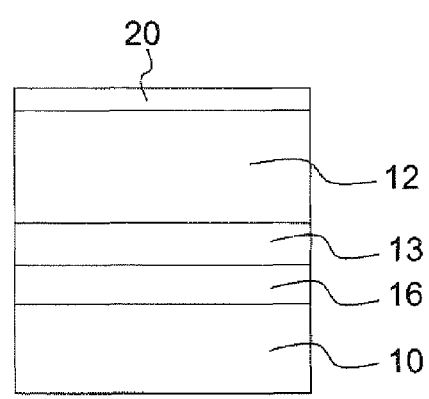

FIGS. 9A to 12B show one example of steps of producing the memory cell array 3. First, the interlayer insulation film 16 such as $SiO_2$ is deposited on whole surface of the Si substrate 10, the lower electrode 13 such as Pt is deposited on the interlayer insulation film 16, and the metal oxide film 12 having the perovskite structure such as PCMO and a Si nitride film (SiN) 20 serving as a cap for processing are deposited in this order. FIGS. 9A and 9B show a structural cross-sectional view at this time. A film thickness of the PCMO film 12 is preferably 20 nm to 100 nm.

Figure 10A:
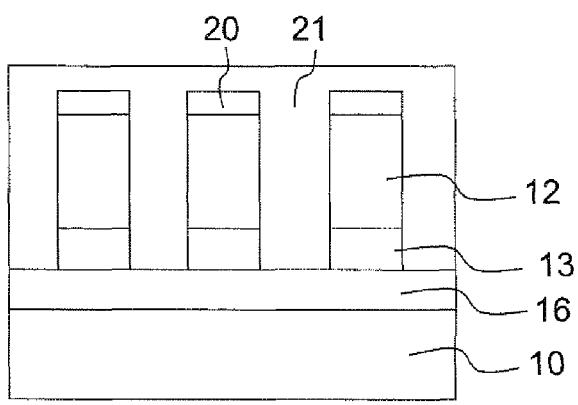
FIGS. 10A and 10B are structural cross-sectional views showing a production step of the memory cell array including the variable resistive element according to the present invention.
Figure 10B:
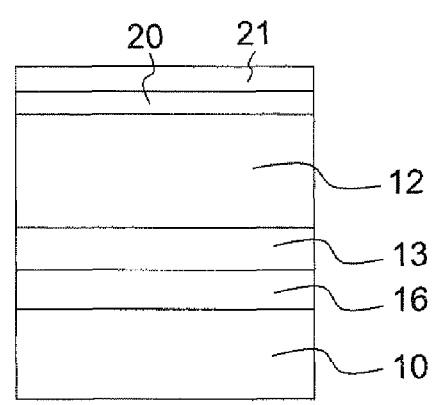

Then, well-known photolithography and etching are conducted for the Si nitride film 20 to the lower electrode 13, and an interlayer insulation film 21 such as $SiO_2$ is deposited to fill a groove formed by the above process. FIGS. 10A and 10B show a structural cross-sectional view at this time.

Figure 11A:
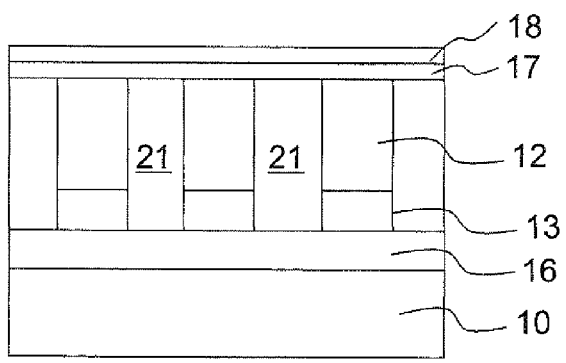
FIGS. 11A and 11B are structural cross-sectional views showing a production step of the memory cell array including the variable resistive element according to the present invention.
Figure 11B:
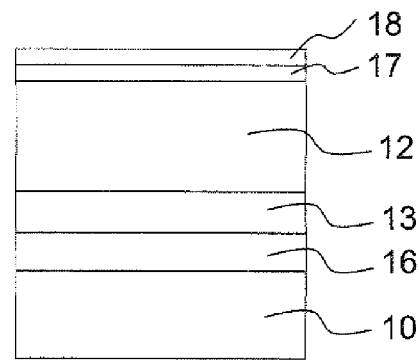

Then, after the interlayer insulation film 21 has been flattened by well-known CMP (Chemical Mechanical Polishing) until the Si nitride film 20 is exposed, the Si nitride film 20 is removed, and the electrode 17 such as Al and the electrode 18 such as TiN are deposited. A thickness of Al serving as the electrode 17 is preferably 10 nm or less. FIGS. 11A and 11B show a structural cross-sectional view at this time.

Figure 12A:
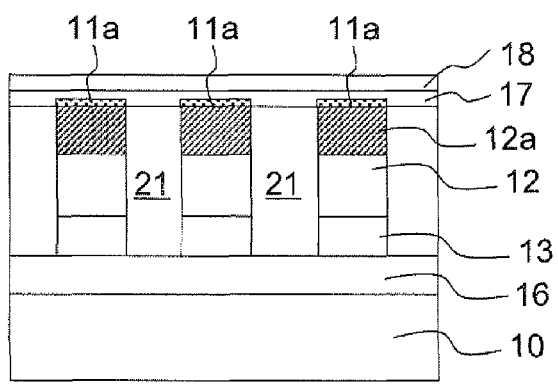
FIGS. 12A and 12B are structural cross-sectional views showing a production step of the memory cell array including the variable resistive element according to the present invention.
Figure 12B:
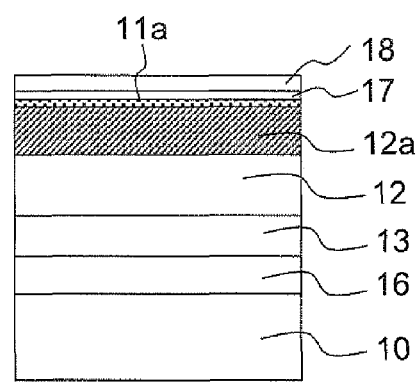

Then, oxygen is extracted from the metal oxide film 12 into the electrode 17 by annealing at 300° C. to 400° C., whereby the metal oxide film (oxygen depletion layer) 12a having the oxygen concentration lower than the stoichiometric composition is formed at the interface between the metal oxide film 12 and the electrode 17. At the same time, the oxide film (Al oxide film) 11a of the electrode 17 is formed to be 1 nm in thickness at the interface on the side of the electrode 17. FIGS. 12A and 12B show a structural cross-sectional view at this time.

Then, well-known photolithography and etching are conducted for the electrode 18 to the metal oxide film 12 in a direction perpendicular to an extending direction of the lower electrode 13, and an interlayer insulation film such as $SiO_2$ is deposited to fill a groove formed by the above process. Thus, the memory cell array 3 is produced as shown in FIGS. 7 to 8B.

Figure 13:
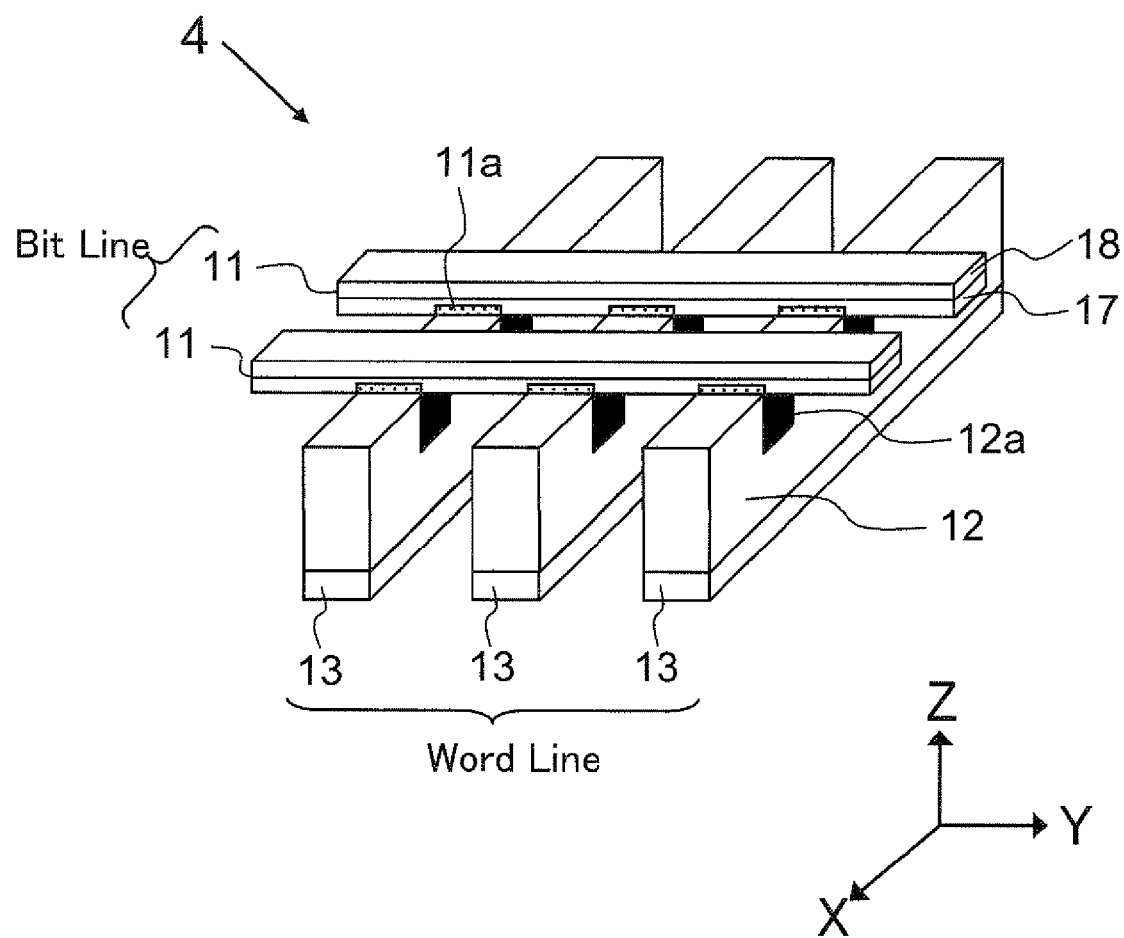
FIG. 13 is a birds-eye view showing an element structure of a memory cell array including the variable resistive element according to the present invention in another example.

FIG. 13 shows another configuration example of a memory cell array used in the device of the present invention. As for a memory cell array 4 shown in a birds-eye view in FIG. 13, the metal oxide film 12 (12a) extends parallel to the lower electrode (word line) 13, and is not physically separated in the extending direction of the lower electrode. However, as shown in a structural cross-sectional view in FIG. 14, each memory cell is electrically separated by rectifier junction layers 11a and 12a formed between the electrode 17 and the metal oxide film 12. Therefore, the memory cell array 4 can function as the memory having cross-point structure, and the memory cell array having the cross-point structure equivalent to that of the memory cell array 3 can be provided by a simpler production process.

The memory cell array 4 is produced by the same steps as those of the memory cell array 3 until the steps shown in FIGS. 9A to 11B. After that, well-known photolithography and etching are conducted for only the electrode 18 and the electrode 17 in a direction perpendicular to the lower electrode 13, and oxygen is extracted from the metal oxide film 12 into the electrode 17 by annealing at 300° C. to 400° C., so that the oxygen depletion layer 12a and the oxide layer 11a of the electrode 17 are formed at the interface between the electrode 17 and the metal oxide film 12, whereby the memory cell array 4 is produced as shown in FIGS. 13 to 14B.

FIG. 15 shows one example of values of operating conditions (voltage application conditions) and operating currents of each memory cell for conducting the writing action of the memory cell array 3 or 4. Here, an area of the variable resistive element 1 (a cross-point area) is 50 nm×50 nm.

A programing action (SET action) from a high resistance state to a low resistance state is performed in such a manner that a voltage pulse of −4V is applied to the upper electrode based on a potential of the lower electrode, as a forward voltage of the rectifier junction. An applying time of the voltage pulse is 5 μs and a current at the time of programming is 20 μA.

Meanwhile, a programing action (RESET action) from the low resistance state to the high resistance state is performed in such a manner that a voltage pulse of 3V is applied to the upper electrode based on the potential of the lower electrode, as a reverse voltage of the rectifier junction. An applying time of the voltage pulse is 10 μs and a current at the time of programming is 200 nA.

As for a reading action of the resistance state, in the case where the reading action is performed by applying a voltage pulse of −1.5V to the upper electrode based on the potential of the lower electrode as the forward voltage of the rectifier junction, 1 μA of current is detected in the low resistance state, and 10 nA of current is detected in the high resistance state. Meanwhile, in the case where the reading action is performed by applying a voltage pulse of 1.5V to the upper electrode based on the potential of the lower electrode as the reverse voltage of the rectifier junction, 100 nA of current is detected in the low resistance state, and 10 nA of current is detected in the high resistance state.

Figure 16:
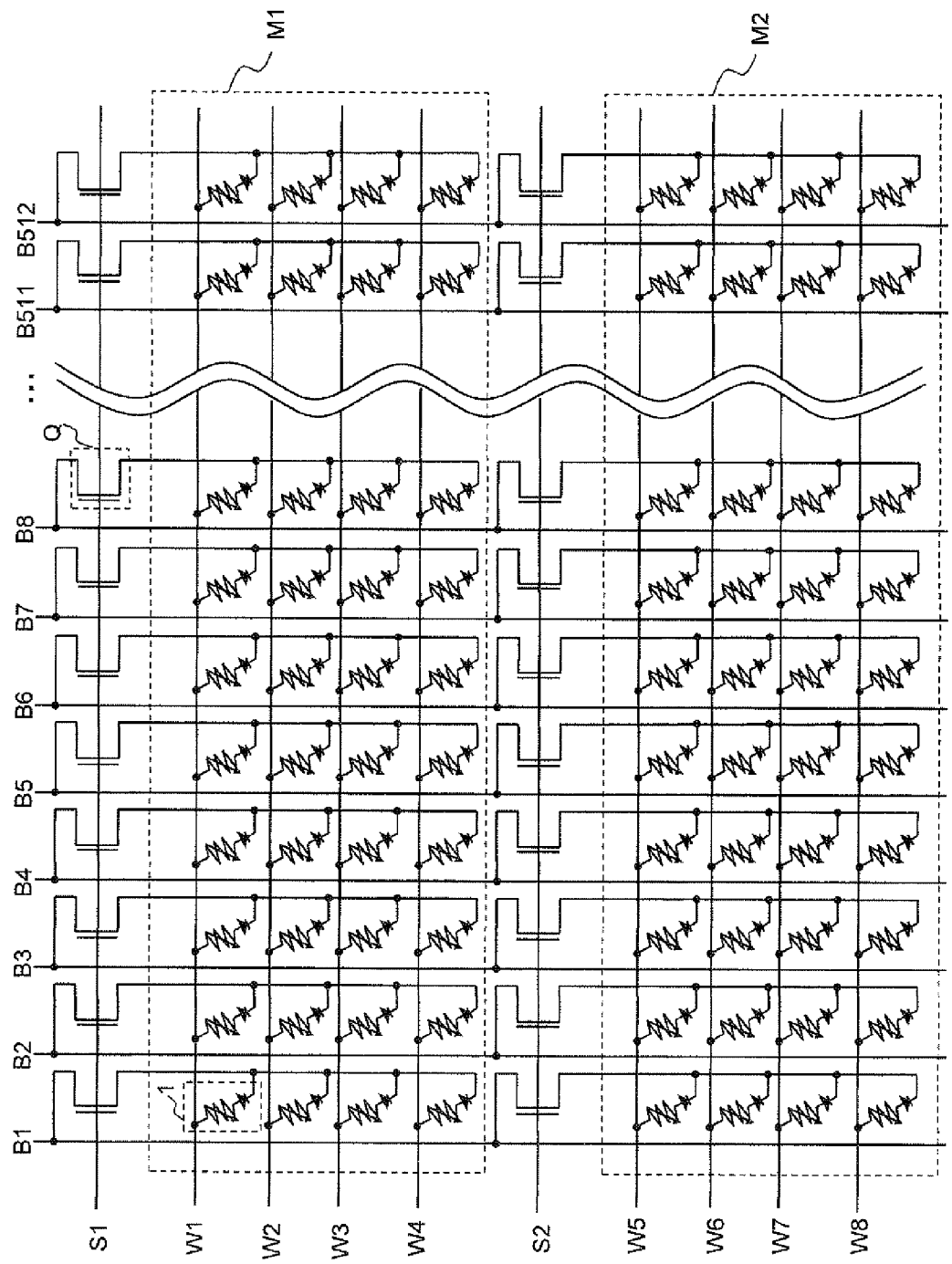
FIG. 16 is a circuit diagram showing one example of the memory cell array including the variable resistive element according to the present invention.

FIG. 16 shows one example of a circuit configuration of the device of the present invention having the memory cell 3 or 4. As shown in FIG. 16, the memory cells composed of the variable resistive element 1 having rectifying properties are arranged in the form of a matrix. Each memory cell is connected any one of word lines W1 to W8 extending in a row direction (horizontal direction in FIG. 16), the predetermined number of memory cells adjacent in a column direction (vertical direction in FIG. 16) are connected to a common bit line extending in the column direction, and the common bit line is connected any one of global bit lines B1 to B512 extending in the column direction, through a bank selecting transistor Q. The bank selecting transistors Q are arranged in the form of a matrix, and gate terminals of the bank selecting transistors arranged in the same position in the column direction are connected to bank selection lines S1, S2, . . . extending in the row direction.

That is, according to the memory cell array shown in FIG. 16, each of small-size memory cell arrays M1, M2 . . . in which a position of the memory cell is specified by the bit line and the word line serves as a unit bank, and the plurality of banks are connected through the bank selecting transistors to constitute the large-size cell array, so that the memory action such as the writing or reading action can be performed by the bank in such a manner that one or more banks are selected by the bank selection line, and the word line and bit line in the selected bank are further selected. According to the example in FIG. 16, one bank is composed of 2048 memory cells specified by the four word lines and 512 bit lines. The four or eight, or multiples of eight word lines are preferably provided in the one bank. In addition, 512 or multiples of 512 bit lines are preferably provided in the one bank.

Hereinafter, a description will be made of a writing action of the memory cell array assuming that the high resistance state is "0" and the low resistance state is "1".

1. First Erasing Action

Figure 17:
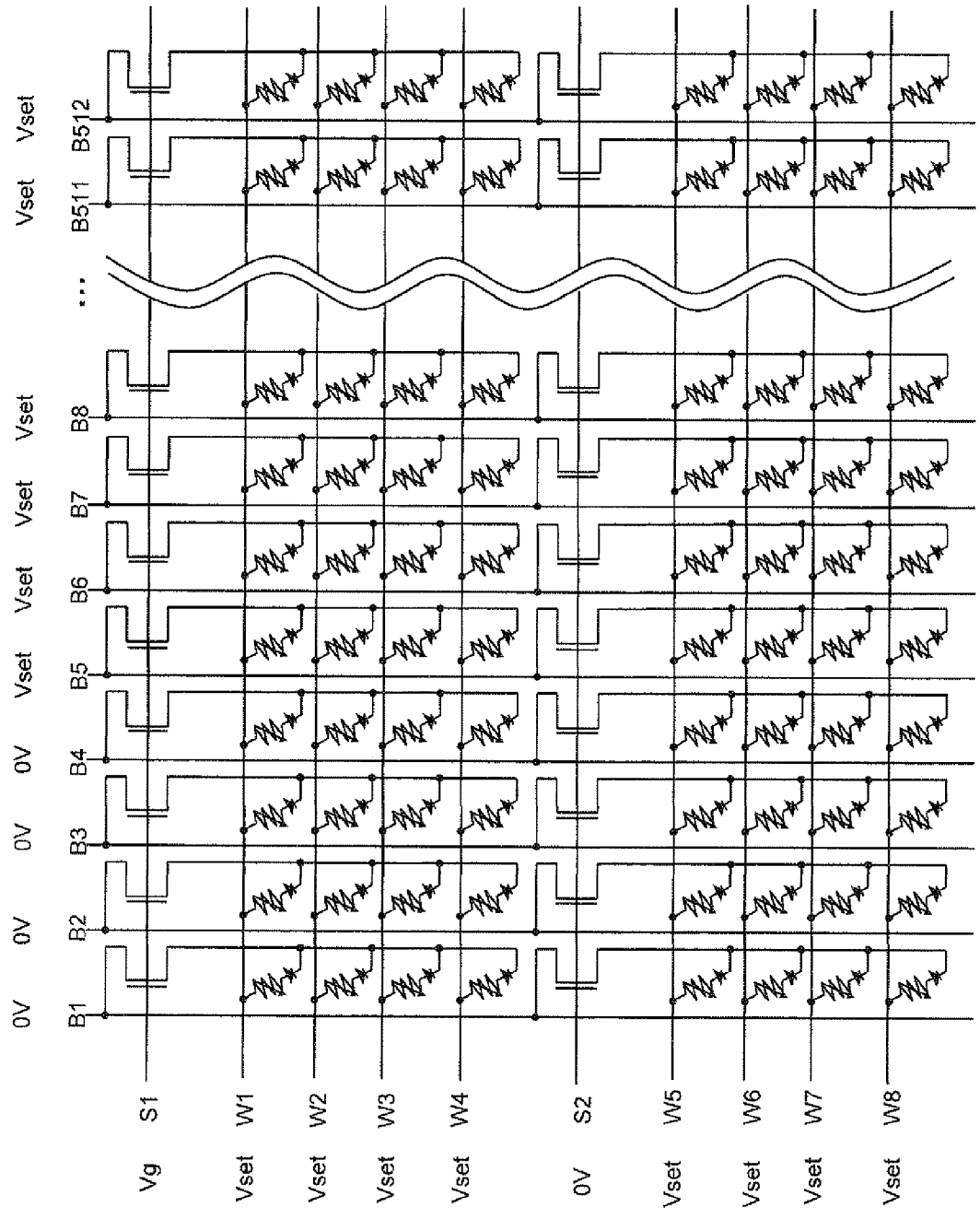
FIG. 17 is a circuit diagram showing a voltage application condition in a first erasing action of the memory cell array including the variable resistive element according to the present invention.

FIG. 17 shows a method of the memory action to set all of the memory cells to the low resistance state ("1"). The bank selecting transistors in the selected bank are turned on through the bank selection line, Vset is applied to all of the word lines belonging to the selected bank, 0V is applied to the selected bit lines through the global bit lines, and Vset (4V in this case) is applied to the unselected bit lines through the global bit lines. In this case, Vset is a voltage of a first threshold value Vt1 or more required for the variable resistive element 1 to shift from the high resistance state to the low resistance state. According to the example in FIG. 16, Vg is applied to the bank selection line S1 to turn on the bank selecting transistors connected to the bank selection line S1, and the bit lines connected to the global bit lines B1 to B4 are selected, so that the plurality of memory cell columns specified by the selected bit lines and all of the word lines W1 to W4 in the selected bank are subjected to the writing action at the same time.

Then, the bit lines which has not been selected yet (such as the bit lines connected to the global bit lines B5 to B8) are selected, and all of the word lines W1 and W4 in the selected bank are selected, so that the plurality of memory cell columns are subjected to the writing action at the same time. Thus, by repeating the above action until the bit lines are all selected, all of the memory cells in the selected bank shift to the low resistance state. Then, another bank is selected through the bank selection line, and the newly selected bank is subjected to the above actions, so that all of the memory cells in the memory cell array shift to the low resistance state ("1").

In addition, while Vset is applied to the word lines W5 to W8 belonging to the unselected bank in FIG. 17, the voltage is not necessarily applied to the word lines W5 to W8 under the condition that 0V is applied to the gate terminals of the bank selecting transistors through the bank selection line S2 to turn off the bank selecting transistors belonging to the unselected bank.

According to the above method, in the case where 1K bit (1024) of the variable resistive elements 1 shown in FIG. 17 shift to the low resistance state at the same time, about 20 mA of writing current flows in total. It takes about 10 msec to write the 2M bit of memory blocks in this condition.

2. First Programming Action

Figure 18:
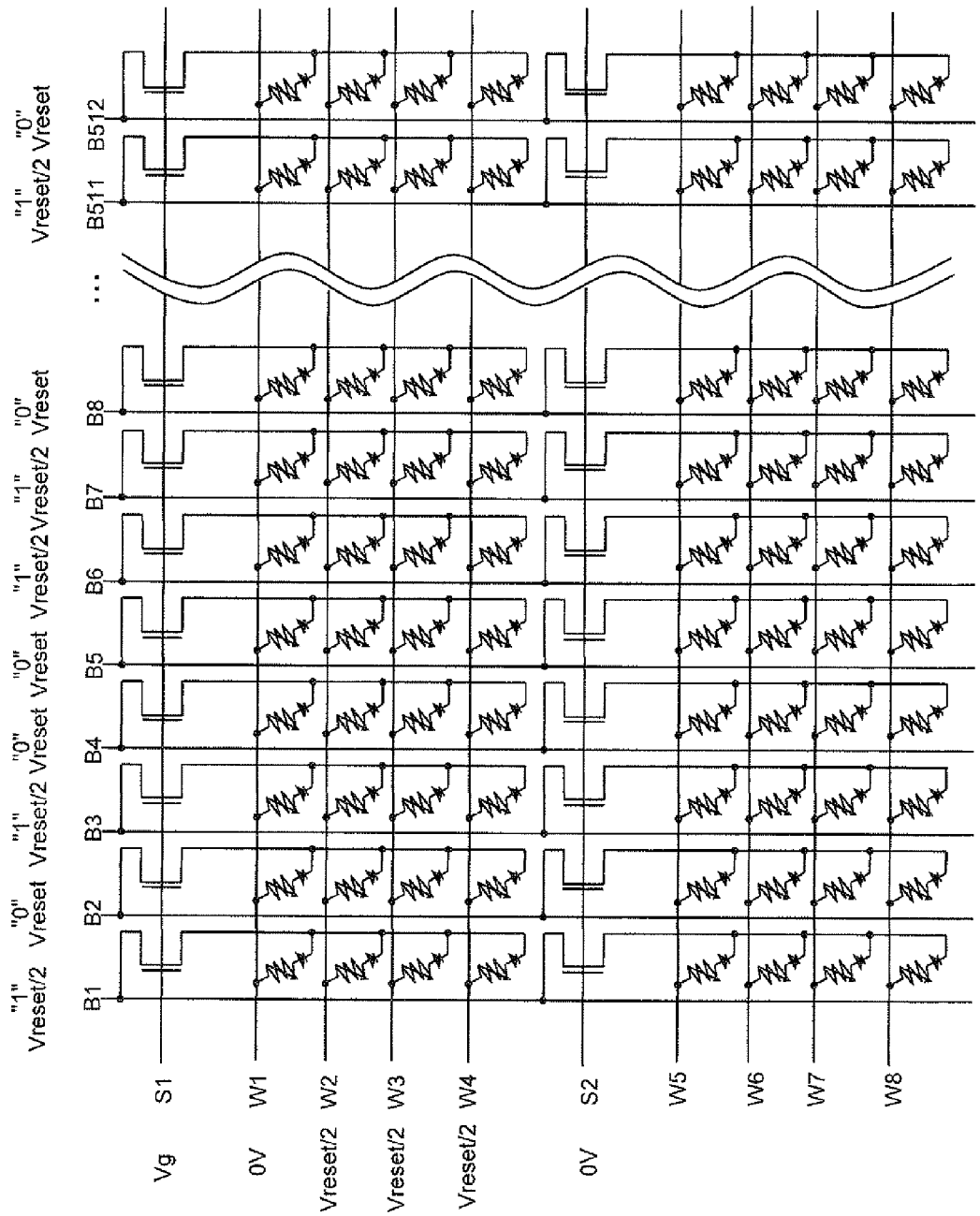
FIG. 18 is a circuit diagram showing a voltage application condition in a first programming action of the memory cell array including the variable resistive element according to the present invention.

FIG. 18 shows a method in which one word line is selected, the memory cells of programming target are selected from the memory cells belonging to the same row connected to the selected word line, and data ("0") is programmed in the selected memory cells at the same time. First, the selecting transistors in the bank to which the selected word line (W1 in this case) belongs are turned on. According to the example shown in FIG. 18, Vg is applied to the bank selection line S1 to turn on the bank selecting transistors in the selected bank, and 0V is applied to the bank selection line S2 to turn off the bank selecting transistors in the unselected bank. Then, 0V is applied to the selected word line W1. Among the memory cells belonging to the same row specified by the selected word line W1 and the selected and unselected bit lines, Vreset (=3V) is applied to the selected bit lines connected to the memory cells to be changed to the high resistance state ("0") through the global bit lines, and Vreser/2 is applied to the unselected bit lines connected to the memory cells to be kept in the low resistance state ("1") through the global bit lines. Thus, Vreset/2 is applied to the unselected word lines W2 to W4 in the bank to which the selected word line belongs. Here, Vreset is a voltage of a second threshold value Vt2 or more required for the variable resistive element 1 to shift from the low resistance state to the high resistance state, and Vreset/2 is set to be less than the second threshold value Vt2.

Thus, Vreset is applied to both ends of the memory cell connected to the selected word line W1 and the selected bit line, and the variable resistive element 1 shifts from the low resistance state ("1") to the high resistance state ("0"), whereby the data ("0") is programmed therein. While Vreset/2 is applied to both ends of the memory cell connected to the selected word line W1 and connected to the unselected bit line, the variable resistive element 1 does not shift to the high resistance state ("0") because the Vreset/2 is less than the second threshold value Vt2, so that the data ("1") before the programming action is kept therein.

Similarly, while Vreset/2 is applied to both ends of the memory cells connected to the unselected word lines W2 to W4 and connected to the selected bit lines, the variable resistive element 1 does not shift to the high resistance state ("0"). In addition, since a voltage is not applied to both ends of the memory cells connected to the unselected word lines W2 to W4 and the unselected bit lines, the resistance state of the variable resistive element 1 does not shift.

Then, the different word line which has not been selected yet (such as W2) is selected and the above actions are repeated for the newly selected word line, so that the selected memory cells in the memory cell array can be all subjected to the programming.

According to the above method of the action, in the case where the one word line is selected and 512 bits of (512) variable resistive elements 1 shown in FIG. 15 are programmed at the same time, up to about 100 μA of current flows in total. In addition, up to about $10^5$ word lines can be selected to perform the programming action for one second. Therefore, in the case where the one word line is selected and 512 K bits of variable resistive elements 1 are programmed at the same time, up to about 10 mA of current flows in total, and about 6.3 G bites of information can be programmed for one second.

According to the method of the action, since the data programming is performed by applying the reverse bias of the rectifier junction, a programming current is suppressed, large volume data can be programmed at the same time, and a very high-speed data transfer rate can be obtained. This is especially preferable for taking in data having a large amount of information, such as image data.

3. Reading Action

Figure 19:
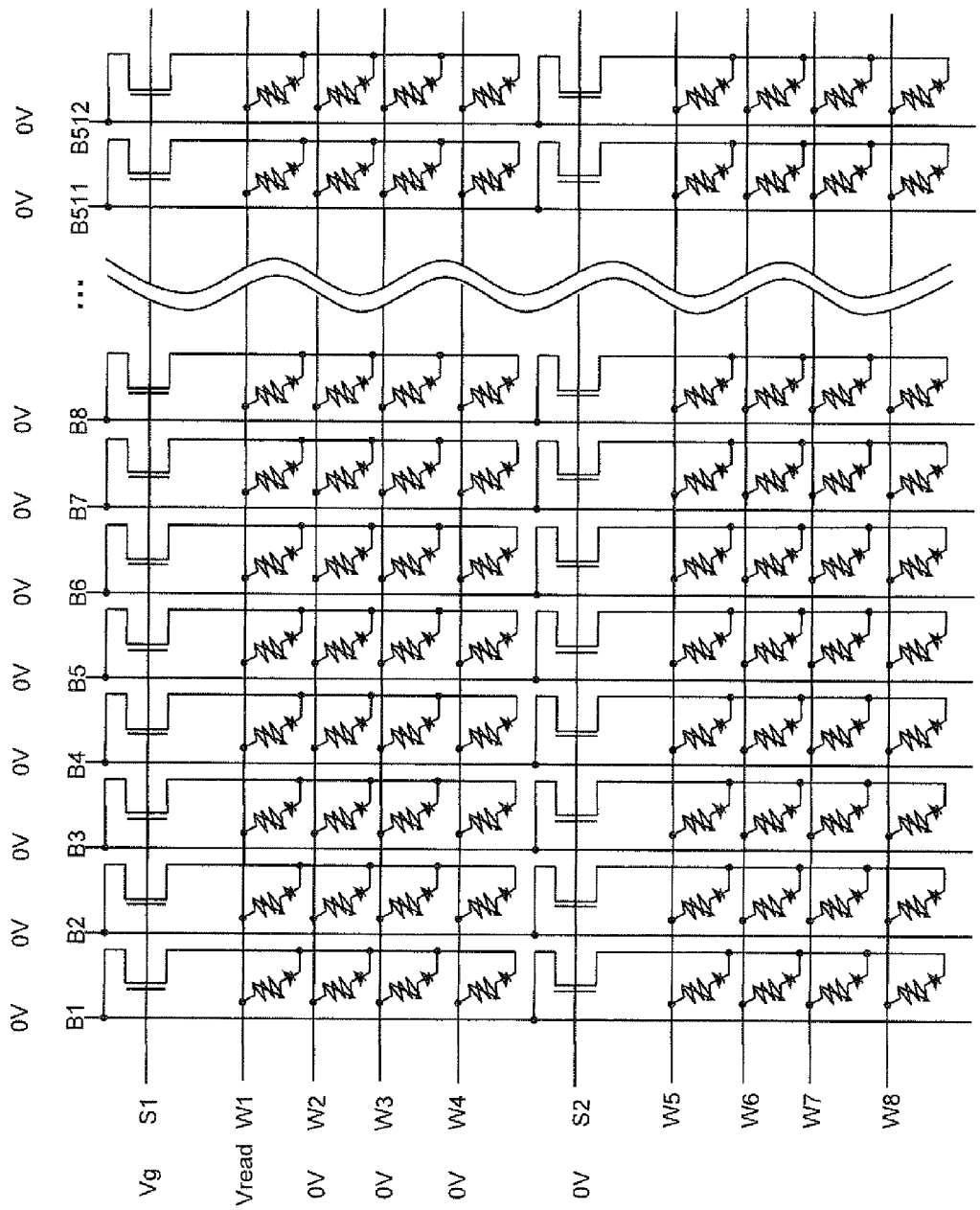
FIG. 19 is a circuit diagram showing a voltage application condition in a reading action of the memory cell array including the variable resistive element according to the present invention.

FIG. 19 shows a method in which one word line is selected and data is read from all of the memory cells in the same row connected to the selected word line, at the same time. First, the bank selecting transistors in the bank to which the selected word line (W1 in this case) belongs are turned on. According to the example shown in FIG. 19, Vg is applied to the bank selection line S1 to turn on the bank selecting transistors in the selected bank, and 0V is applied to the bank selection line 52 to turn off the bank selecting transistors in the unselected bank. Thus, Vread (1.5V in this case) is applied to the selected word line W1, and 0V is applied to the unselected word lines and all the bit lines in the bank through the global bit lines B1 to B512 as the forward bias of the rectifier junction, to detect a current amount flowing from the word line to each bit line with the readout circuit connected to each global bit line.

4. Second Erasing Action

Figure 20:
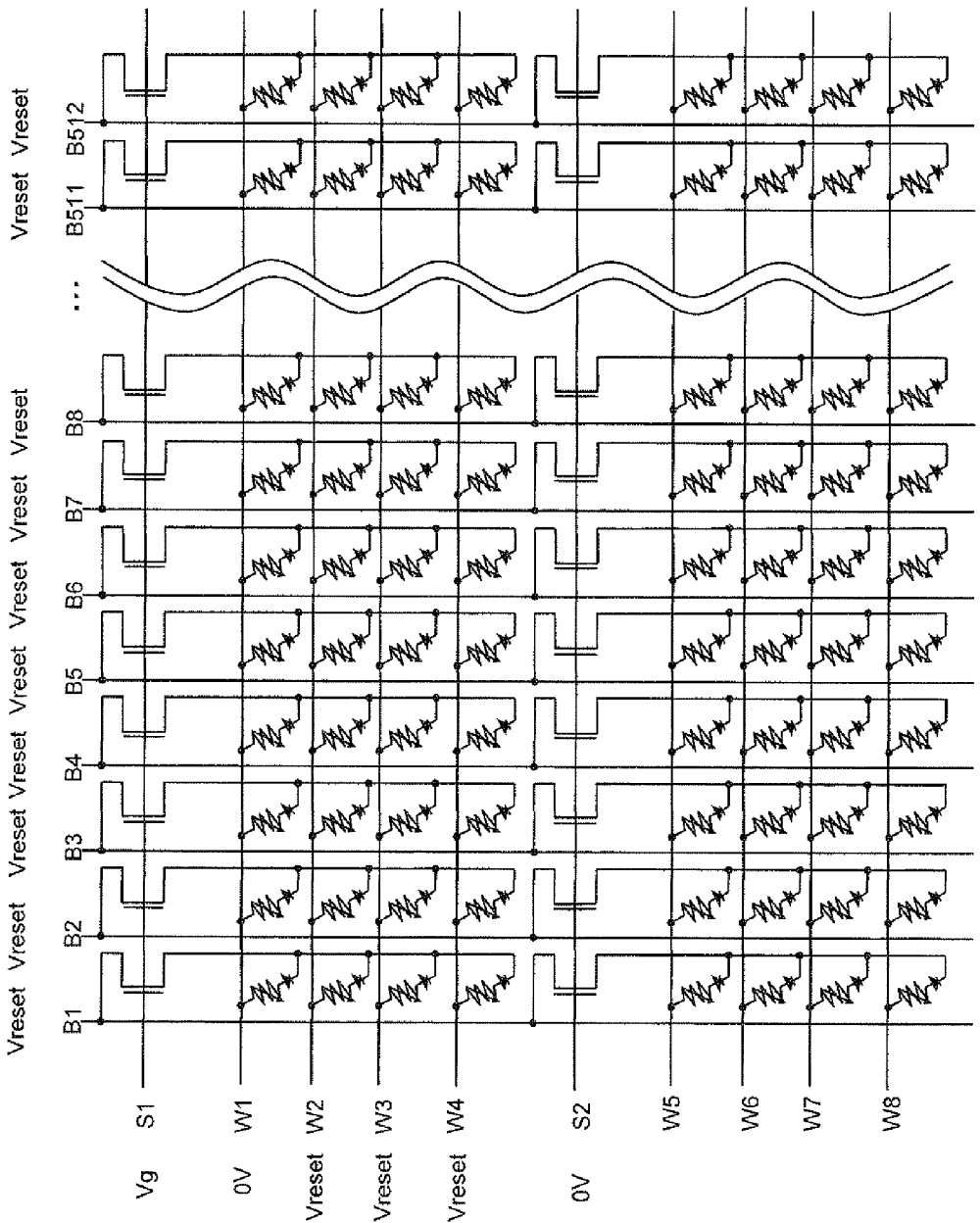
FIG. 20 is a circuit diagram showing a voltage application condition in a second erasing action of the memory cell array including the variable resistive element according to the present invention.

FIG. 20 shows a method of a memory action to make all the memory cells shift to the high resistance state ("0"). The selecting transistors are turned on in the bank to which the selected word line (W1 in this case) belongs. According to the example shown in FIG. 20, Vg is applied to the bank selection line S1 to turn on the bank selecting transistors in the selected bank, and 0V is applied to the bank selection line S2 to turn off the bank selecting transistors in the unselected bank. Then, 0V is applied to the selected word line W1, and Vreset (3V in this case) is applied to the unselected word lines and all the bit lines in the bank through the global bit lines B1 to B512, whereby the memory cell rows specified by the selected word line W1 and all of the bit lines are subjected to the writing action at the same time, and the resistance state of the variable resistive elements 1 shifts to the high resistance state.

Then, the different word line (such as W2) which has not been selected yet is selected, and the above actions are repeated for the newly selected word line, whereby the resistance state of the variable resistive elements 1 of all of the selected memory cells in the memory cell array shifts to the high resistance state.

According to the above method of the action, since the writing action is performed by applying the reverse bias of the rectifier junction, a programming current is suppressed compared with the above first erasing action, and the more memory cells can be written to the high resistance state at the same time. For example, in FIG. 20, even when 2K bits of the variable resistive elements 1 can be all written at the same time by selecting all of the word lines W1 to W4 and all of the bit lines in the one bank, only about 400 μA of writing current flows in total. It takes about 10 msec to write the 2M bits of memory block in this condition.

5. Second Programming Action

Figure 21:
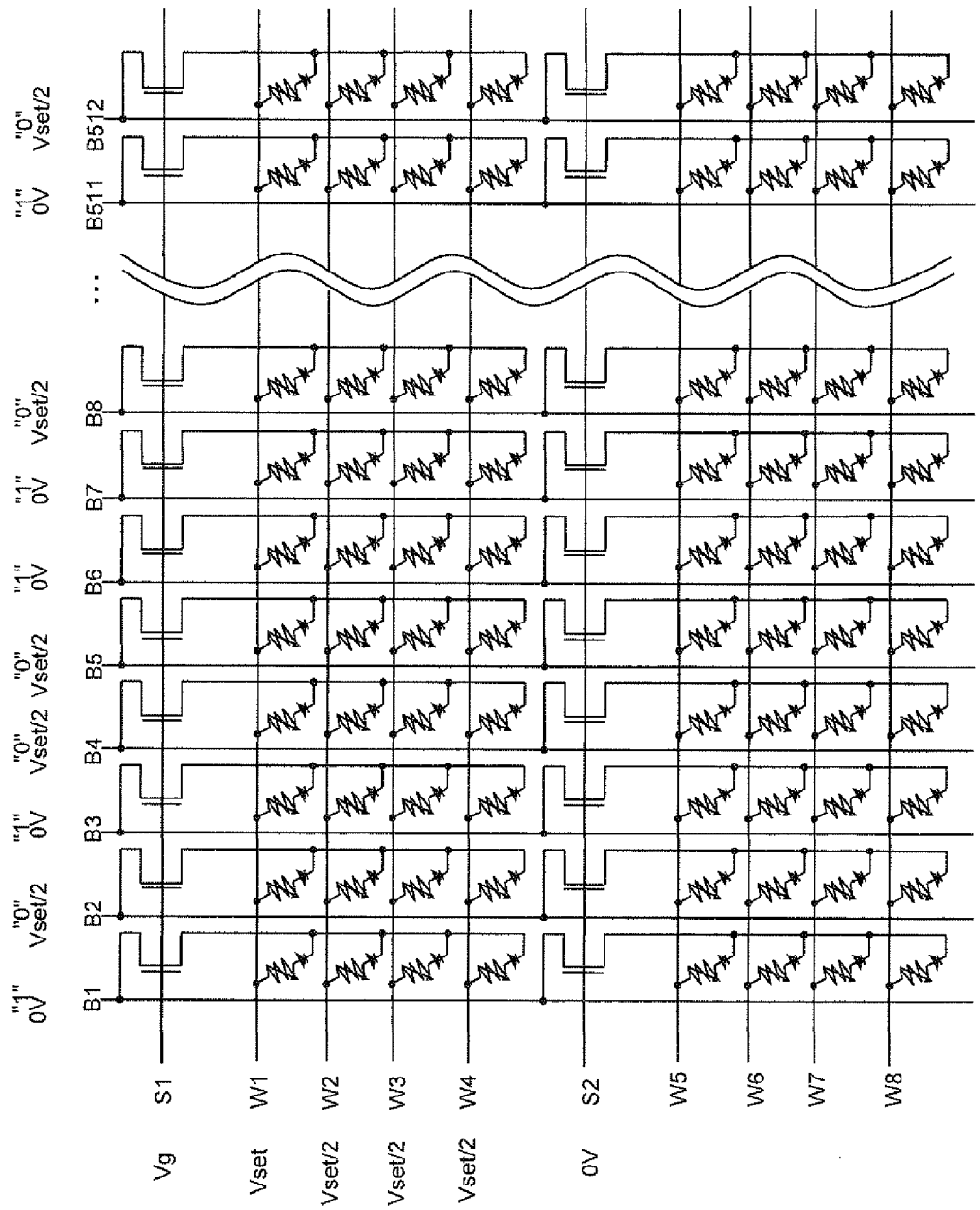
FIG. 21 is a circuit diagram showing a voltage application condition in a second programming action of the memory cell array including the variable resistive element according to the present invention.

FIG. 21 shows a method in which one word line is selected, the memory cells targeted for the programming are selected from the memory cells in the same row connected to the selected word line, and data ("1") is programmed therein at the same time. According to the example in FIG. 21, a voltage is applied to the word line W1 and the bit line group connected to the global bit lines B1 to B8, and the data ("1") is programmed in the selected memory cells at the same time.

First, the bank selecting transistors in the bank to which the selected word line (W1 in this case) belongs are turned on. That is, Vg is applied to the bank selection line S1 to turn on the bank selecting transistors in the selected bank, and 0V is applied to the bank selection line S2 to turn off the bank selecting transistors in the unselected bank. Thus, Vset (=4 V) is applied to the selected word line W1. Among the memory cells specified by the selected word line W1 and the bit lines, 0V is applied to the selected bit lines connected to the memory cells to be changed to the low resistance state ("1") through the global bit lines, and Vset/2 is applied to the unselected bit lines to be kept in the high resistance state ("0") through the global bit lines. Thus, Vset/2 is applied to the unselected word lines W2 to W4 in the bank to which the selected word line belongs. Here, Vset is the voltage of the first threshold value Vt1 or more required for the variable resistive element 1 to shift from the high resistance state to the low resistance state, and Vset/2 is set to be less than the first threshold value Vt1.

Thus, Vset is applied to both ends of the memory cells connected to the selected word line W1 and the selected bit lines, and the variable resistive element 1 shifts from the high resistance state ("0") to the low resistance state ("1"), so that the data ("1") is programmed therein. While Vset/2 is applied to both ends of the memory cells connected to the selected word line W1 and connected to the unselected bit lines, the variable resistive element 1 does not shift to the low resistance state ("1") because the Vreset/2 is less than the first threshold value Vt1, so that the data ("0") before the programming action is kept therein. Similarly, while Vset/2 is applied to both ends of the memory cells connected to the unselected word lines W2 to W4 and connected to the selected bit lines, the variable resistive element 1 does not shift to the low resistance state ("1"). In addition, a voltage is not applied to both ends of the memory cells connected to the unselected word lines W2 to W4 and the unselected bit lines, so that the resistance state of the variable resistive element 1 does not shift.

According to the above method of the action, in the case where the one word line is selected and 512 bits of (512) variable resistive elements shown in FIG. 15 are programmed at the same time, up to about 100 mA of current flows in total. In addition, $2 \times 10^5$ word lines can be selected to perform the programming action for one second. Therefore, in the case where the one word line is selected, and 512 K bits of variable resistive elements 1 are programmed at the same time by the above method, about 12.5 M bites of information can be programmed for one second.

According to the method of the action, since the data programming is performed by applying the forward bias of the rectifier junction, a program current is large, which is not suitable for the case where large amount of data is programmed at the same time. Therefore, the programming speed is not always higher than the first programming action, but since writing disturb is hardly generated, this method is suitable for the case where the small-size data is frequently programmed such as program storage.

Thus, when the memory cell array 3 or 4 is divided into two memory regions, one memory region is used as a data storage region in which the writing action is performed by the above first erasing action and first programming action, and the other region is used as a data storage region in which the writing action is performed by the above second erasing action and second programming action, the high-speed access can be realized and highly-reliable nonvolatile semiconductor memory device can be provided.

Second Embodiment

Figure 22:
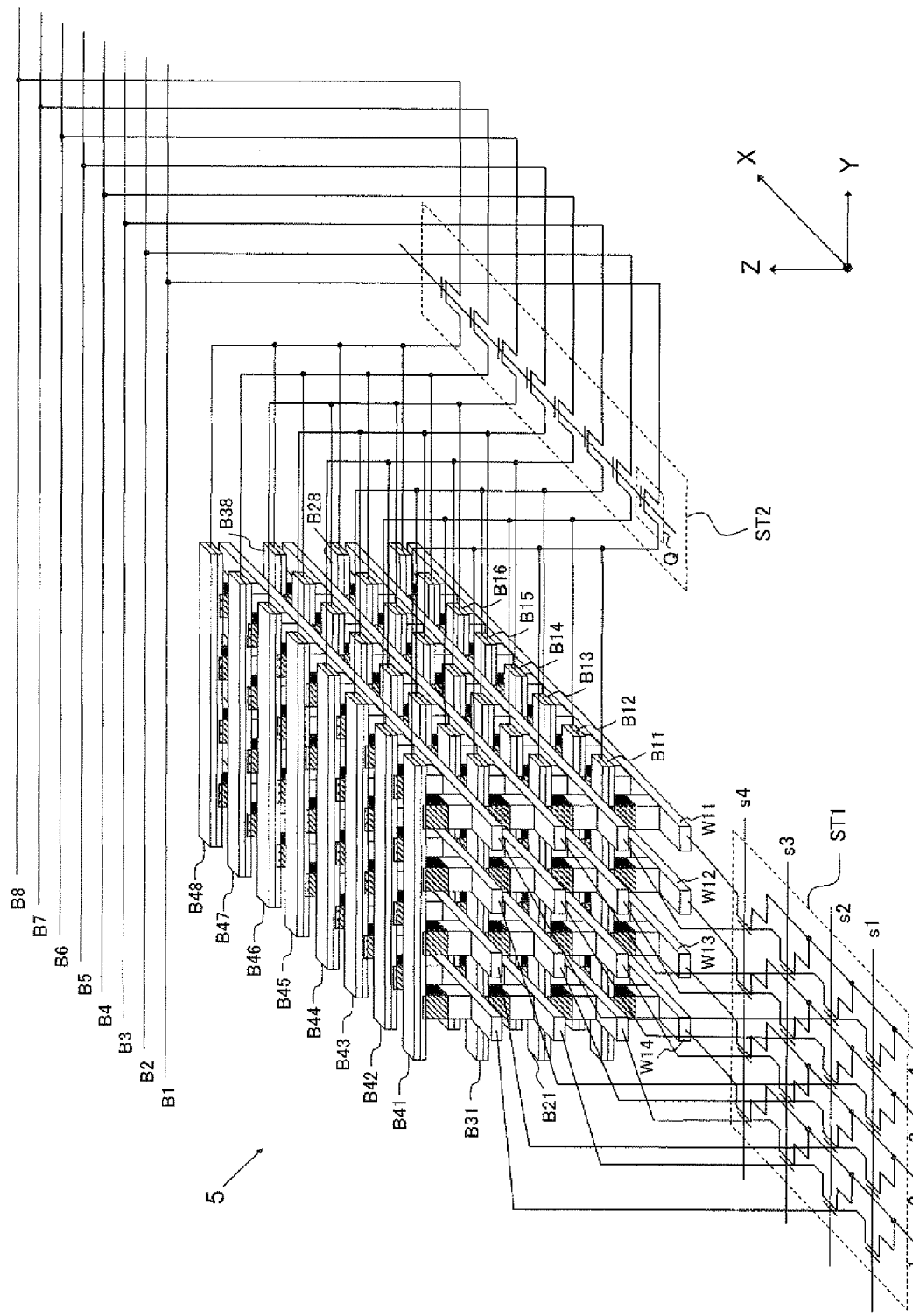
FIG. 22 is a cross-sectional view showing an element structure of a three-dimensional memory cell array including the variable resistive element according to the present invention.

The device of the present invention can further increase its capacity by employing a three-dimensionally-multilayered memory cell array configuration. FIG. 22 shows a circuit configuration diagram of a memory cell array 5 in which the memory cell arrays 3 shown in FIG. 7 are multilayered. The memory cell array 5 is provided in such a manner that the four memory cell arrays 3 in which the memory cells are specified by the four word lines and the eight bit lines (4×8) are laminated in a third direction (Z direction) perpendicular to the word lines and the bit lines.

Among the word lines W11 to W44 extending in the row direction (X direction), the word lines arranged in the same position in the column direction (Y direction) and in the different positions in the third direction are connected to any one of selection lines w1 to w4 extending in the common row direction through corresponding transistors in a transistor array ST1. The transistors in the transistor array ST1 are arranged in a two-dimensional manner, and one end of an input/output terminal pair is connected to any one of the corresponding word lines W11 to W44, and the other end of the input/output terminal pair is connected to any one of the selection lines w1 to w4. Meanwhile, gate terminals of the transistors whose one ends of the input/output terminal pairs are connected to the word lines arranged in the same position in the third direction and in different positions in the column direction are connected to common selection lines s1 to s4, respectively.

Among the bit lines B11 to B48 extending in the column direction, the bit lines arranged in the same position in the row direction and different positions in the third direction are connected any one of the common global bit lines B1 to B8, through transistors Q in a transistor array ST2. The transistor Q corresponds to the bank selecting transistors in FIGS. 16 to 21.

Thus, the positions of the memory cells in the row direction (Y direction) are specified by the global bit lines B1 to B8, the positions of the memory cells in the column direction (X direction) in the memory cell array 5 are specified by the selection lines w1 to w4, and the positions of the memory cells in the third direction (Z direction) in the memory cell array 5 are specified by the selection lines s1 to s4. The global bit lines B1 to B8 are connected to a column decoder, the selection lines w1 to w4 are connected to a row decoder, and the selection lines s1 to s4 are connected to a third decoder, whereby the device of the present invention is constituted.

Figure 24A:
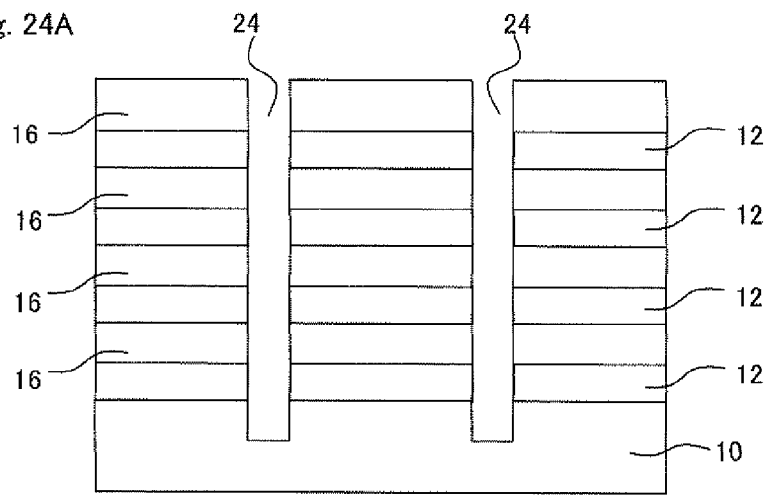
FIGS. 24A to 24C are cross-sectional views showing the other example of the element structure of the three-dimensional memory cell array including the variable resistive element according to the present invention, and structural cross-sectional views in production steps.
Figure 24B:
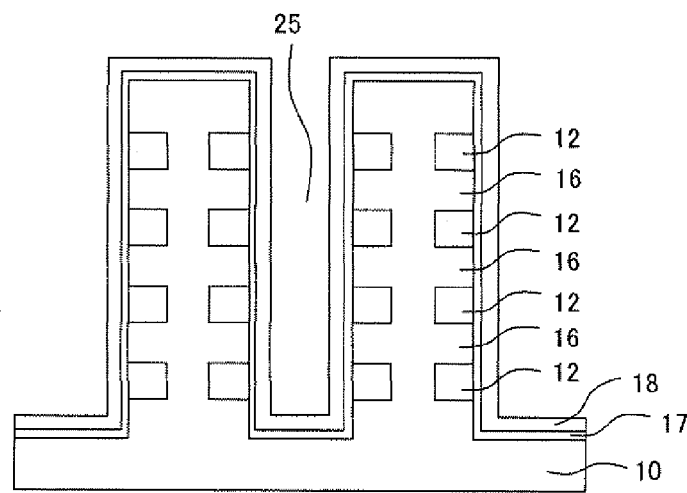
Figure 24C:
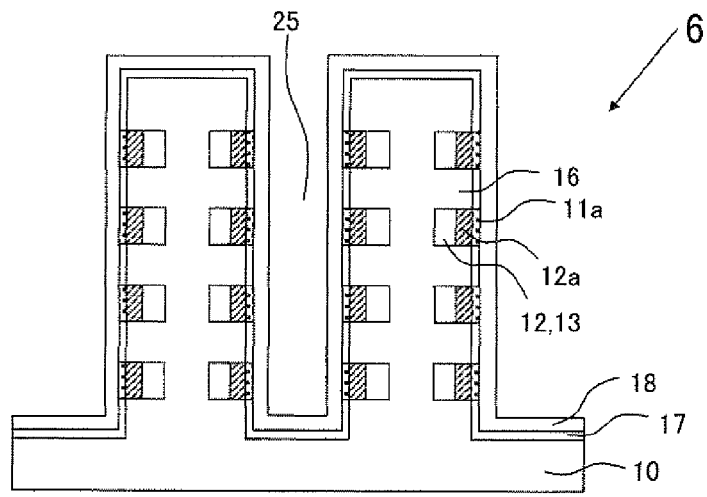

FIGS. 23 to 24C show another configuration of a third-dimensional memory cell array. According to a memory cell array 6 shown in a birds-eye view in FIG. 23, while the structure of the memory cell array shown in FIG. 22 is maintained, production steps are considerably simplified such that a laminated structure of the metal oxide film 12 and interlayer insulation film 16 is patterned so as to extend in the row direction (X direction), and the bit lines B1 and B2 (11) extending in the direction (Z direction) perpendicular to the substrate are in contact with the metal oxide film 12 on a side wall surface of the laminated structure, whereby the memory cell array having the cross-point structure is formed.

FIGS. 24A to 24C show a method for producing the memory cell array 6. FIG. 24A to 24C are cross-sectional structure views taken along a Y-Z cross-section containing the bit line B1 in production steps. First, interlayer insulation films and the metal oxide films 12 (PCMO in this case) are alternately laminated on the Si substrate 10, and a groove 24 extending in the row direction is formed by well-known photolithography and etching. FIG. 24A shows a cross-sectional view at this time.

Then, the groove 24 is filled with an insulation film, and a groove 25 extending in the different row direction is formed between the grooves 24. Then, Al as the electrode 17 and Pt as the electrode 18 are deposited on the whole surface, and the electrodes 17 and 18 are processed into a stripe shape in the row direction by well-known photolithography and etching. FIG. 24B shows a cross-sectional view at this time.

Then, oxygen in the metal oxide film 12 is moved into the electrode 17 by annealing, and the oxygen depletion layer 12a having the oxygen concentration lower than the stoichiometric composition is formed at the interface between the metal oxide film 12 and the electrode 17 on the side of the metal oxide film 12, and the oxide layer 11a is formed on the side of the electrode 17, whereby the memory cell array 6 is produced as shown in FIG. 24C.

Figure 25:
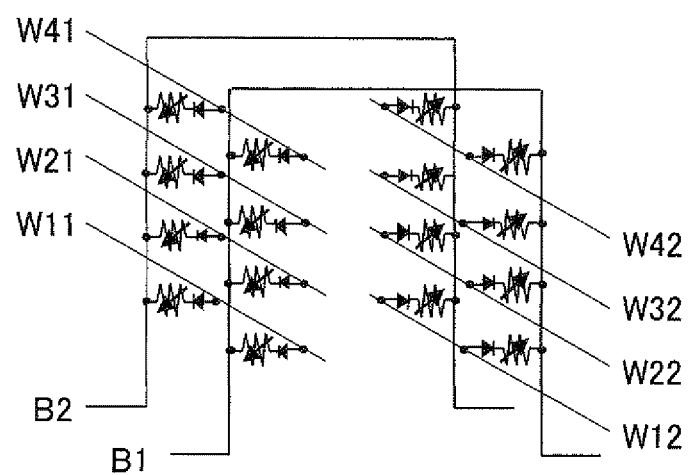
FIG. 25 is an equivalent circuit diagram of the other example of the element structure of the three-dimensional memory cell array including the variable resistive element according to the present invention.

According to the above embodiment, the metal oxide film 12 functions as the variable resistor having the oxygen depletion layer at the interface between the metal oxide film 12 and the electrode 17, and functions as the electrode (word line) 13 connected to the variable resistor. FIG. 25 shows an equivalent circuit diagram of the memory cell array 6. The memory cell array 6 is provided in such a manner that the bit lines B1 and B2 are connected to the column decoder, and the word lines W11 to W42 are connected to the row decoder and the third decoder through the transistor array ST1 in FIG. 22, whereby the device of the present invention is constituted.

Figure 27:
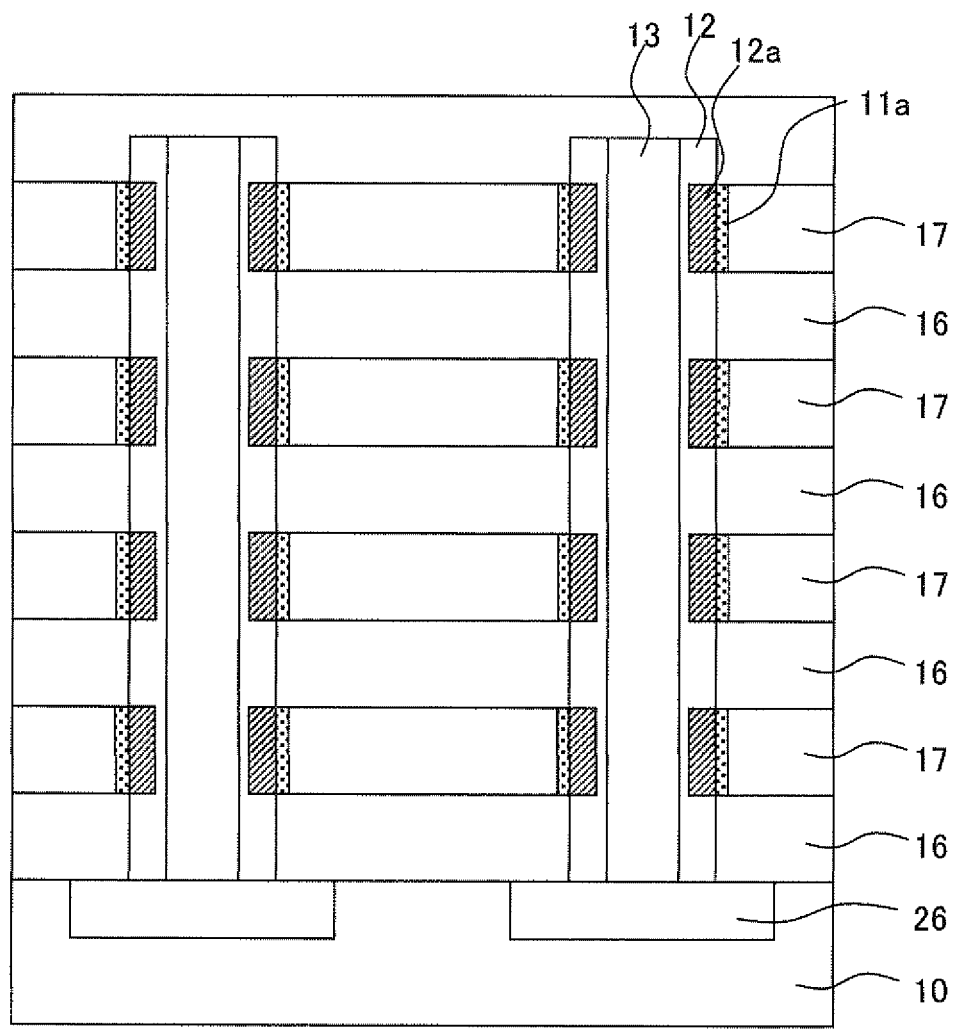
FIG. 27 is a cross-sectional view showing the other example of the element structure of the three-dimensional memory cell array including the variable resistive element according to the present invention.
Figure 28:
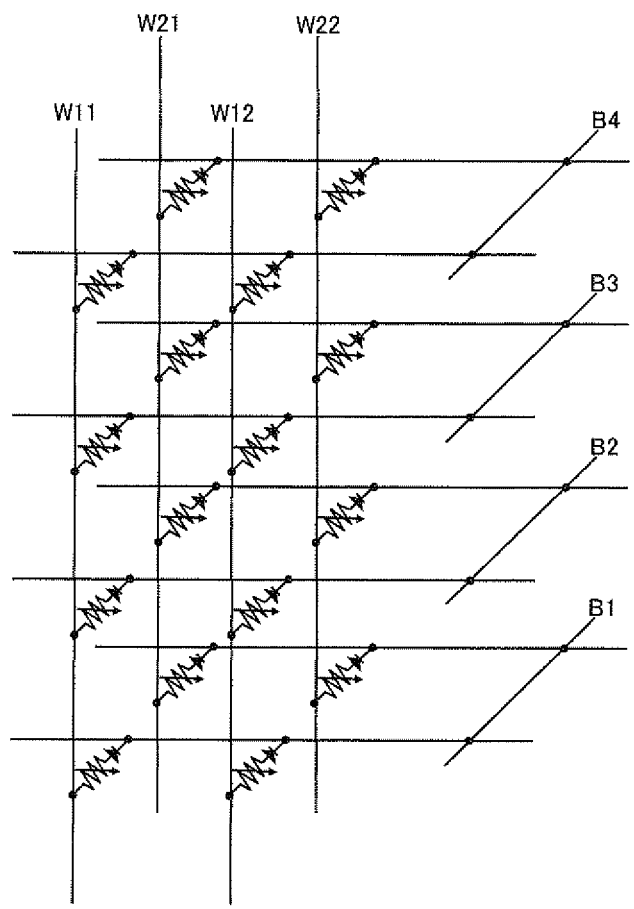
FIG. 28 is an equivalent circuit diagram of the other example of the element structure of the three-dimensional memory cell array including the variable resistive element according to the present invention.

FIGS. 26 and 27 show another configuration of a third-dimensional memory cell array. A memory cell array 7 shown in a birds-eye view in FIG. 26 is provided in such a manner that an inner peripheral side wall surface of a through hole penetrating the laminated structure of the electrode 17 and the interlayer insulation film is covered with the metal oxide film 12, and the through hole is filled with the electrode 13. For example, the metal oxide film 12 is the PCMO film, the electrode 13 is the Pt film, and the electrode 17 is the Al film. FIG. 27 shows a cross-sectional structure view taken along a X-Z section or Y-Z cross-section containing an axis of the through hole. At the interface between the metal oxide film 12 and the Al film 17, the oxygen depletion layer 12a is formed on the side of the metal oxide film 12, and the oxide layer 11a of the electrode 17 is formed on the side of the electrode 17, whereby the variable resistive element 1 having rectifying properties is formed. FIG. 28 shows an equivalent circuit diagram of the memory cell array 7. The electrode 13 functions as the word lines W11 to W22, and extends in the direction (Z direction) perpendicular to the substrate, and the word line is connected to a source region 26 of each transistor of the transistor array ST1 formed on the Si substrate 10. The flat-shape electrode 17 functions as the bit lines B1 to B4.

Figure 30:
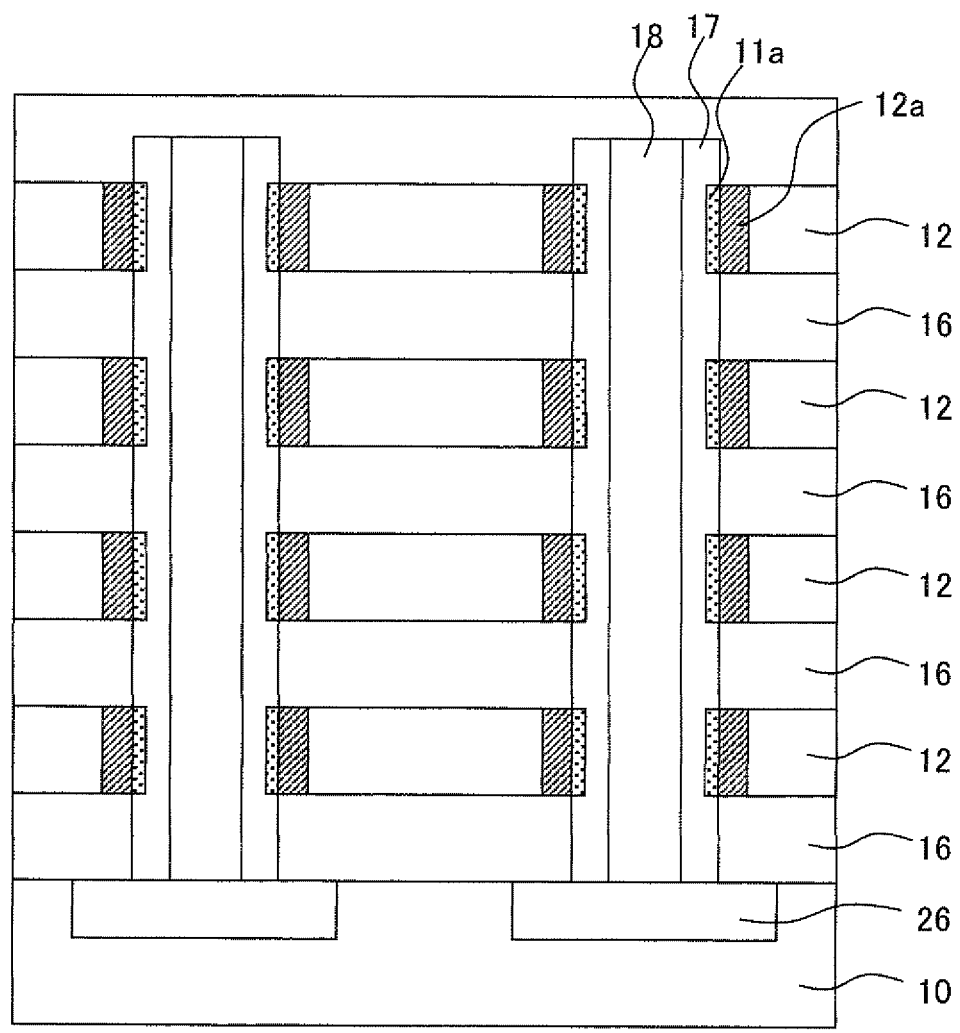
FIG. 30 is a cross-sectional view showing the other example of the element structure of the three-dimensional memory cell array including the variable resistive element according to the present invention.

Similarly, a memory cell array 8 shown in a birds-eye view in FIG. 29 is provided in such a manner that an inner peripheral side wall surface of a through hole penetrating the laminated structure of the metal oxide film 12 and the interlayer insulation film is covered with the electrode 17, and the through hole is filled with the electrode 18. For example, the metal oxide film 12 is the PCMO film, the electrode 17 is the Al film, and the electrode 18 is the Pt film. At the interface of the metal oxide film 12 and the Al film 17, the oxygen depletion layer 12a is formed on the side of the metal oxide film 12, and the oxide layer 11a of the electrode 17 is formed on the side of the electrode 17, whereby the variable resistive element 1 having rectifying properties is formed. FIG. 30 shows a cross-sectional structure view in an X-Z cross-section or Y-Z cross-section containing an axis of the through hole.

The electrodes 17 and 18 function as the word lines and extend in the direction perpendicular to the substrate, and the word line is connected to the source region 26 of each transistor of the transistor array ST1 formed on the Si substrate 10. The metal oxide film 12 functions as a variable resistor having the oxygen depletion layer 12a, and functions as the electrode (bit line) connected to the variable resistor to connect the variable resistive elements to each other. While an equivalent circuit view of the memory cell array 8 is the same as FIG. 28, the polarity of the rectifier junction is opposite to that in FIG. 28. Therefore, when the memory action is performed on the memory cell array 8, it is necessary to reverse the relationship of the voltages applied to the bit line and the word line, in each memory action shown in FIGS. 17 to 21. That is, in FIGS. 17 to 21, the voltage to be applied to the selected (unselected) bit line is applied to the selected (unselected) word line, and the voltage to be applied to the selected (unselected) word line is applied to the selected (unselected) bit line.

Therefore, the present invention provides the nonvolatile semiconductor memory device equipped with the cross-point memory having the 1R structure including the variable resistive element having both switching characteristics and rectifying properties, and provides the nonvolatile semiconductor memory device in which a leak current is prevented, capacity is increased, and high-speed access is realized.

Another Embodiment

Hereinafter, a description will be made of another embodiment of the present invention.
(1) While the oxide film having the perovskite structure in which resistance changes depending on the oxygen concentration in the film is formed of PCMO ($Pr_{1-X}Ca_XMnO_3$) or SCMO ($Sm_{1-X}Ca_XMnO_3$) in the above embodiment, the present invention is not limited to that material. It may be formed of a conductive oxide having the perovskite structure expressed by a chemical formula "$ABO_3$", such as $Pr_{1-X}Ca_X[Mn_{1-Z}M_Z]O_3$ in which a part of Mn of B site of the PCMO is replaced with a transition metal element M such as Ta, Ti, Cu, Cr, Co, Fe, Ni, or Ga, or $La_{1-X}AE_XMnO_3$ in which a part of La of A site of $LaMnO_a$ (LMO) is replaced with divalent alkali earth metal RE such as Ca, Sr, Pb, or Ba, or $RE_{1-X}Sr_XMnO_3$ in which a part of a rare earth element RE of A site is replaced with Sr, in an oxide of a trivalent rare earth element RE such as Sm, La, Pr, Nd, Gd, or Dy, and Mn. In addition, the material may be $La_{1-X}Co_X[Mn_{1-Z}Co_Z]O3$ in which a part of La of A site and a part of Mn of B site of the LMO are replaced with Co. As another example, the material may be $Gd_{1-X}Ca_XMnO_3$ in which a part of Gd of $GdMnO_3$ is replaced with Ca, or $Nd_{1-X}Gd_XMnO_3$ in which a part of Nd of $NdMnO_3$ is replaced with Gd.

While these materials cause the phenomenon in which the electric resistance changes when a voltage pulse is applied, among them, it is preferable that the material of $Pr_{1-X}Ca_XMnO_3$ (PCMO) having a composition in which X is about 0.3 is used as the variable resistor of the present invention because a change in resistance value is large.

(2) In the above first embodiment, the description has been made of the case where the memory cell array is divided into the two memory regions in which one memory region is written by the first erasing action and the first programming action, and the other memory region is written by the second erasing action and the second programming action. Meanwhile, as described in the above second embodiment, in the case where the memory cell array is configured in the three-dimensional manner with the multilayer structure, one or more layers of the multilayered memory cell array are allocated to a data storage region to be written by the first erasing action and the first programming action, and the rest of the layers are allocated to a program storage region to be written by the second erasing action and the second programming action.

The present invention can be applied to the nonvolatile semiconductor memory device, and especially, can be applied to the nonvolatile semiconductor memory device equipped with the nonvolatile variable resistive element in which its resistance state shifts due to the voltage application, and the resistance state after shifting is held in a nonvolatile manner.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A nonvolatile semiconductor memory device comprising a memory cell array provided in such a manner that nonvolatile variable resistive elements each having a variable resistor formed of a metal oxide film having resistance changing depending on an oxygen concentration in the film, an insulation film having contact with the variable resistor, a first electrode connected to the variable resistor through the insulation film, and a second electrode directly connected to the variable resistor without passing through the insulation film, are arranged in at least row and column directions in the form of a matrix, wherein the variable resistive element is provided in such a manner that
an oxygen depletion layer having an oxygen concentration lower than a stoichiometric composition, in the metal oxide film serving as the variable resistor, is formed at an interface between the variable resistor and the first electrode on the side of the variable resistor, connection between the first electrode and the variable resistor is rectifier junction with the insulation film interposed therebetween, connection between the second electrode and the variable resistor is ohmic junction, oxygen reversibly moves between the insulation film and the variable resistor when a voltage having an absolute value of a first threshold value or more is applied across the first and second electrodes in a forward direction of the rectifier junction, the oxygen depletion layer narrows, and resistance characteristics of the variable resistive element shifts to a low resistance state, oxygen reversibly moves between the insulation film and the variable resistor when a voltage having an absolute value of a second threshold value or more is applied across the first and second electrodes in a reverse direction of the rectifier junction, the oxygen depletion layer widens, and the resistance characteristics of the variable resistive element shifts to a high resistance state, and each of the resistance characteristics of the low resistance state and the resistance characteristics of the high resistance state has asymmetric characteristics such that when a predetermined voltage is applied across the first and second electrodes, a current amount flowing in the variable resistive element is large in the case where the voltage is applied in the forward direction of the rectifier junction, and small in the case where the voltage is applied in the reverse direction of the rectifier junction.

2. The nonvolatile semiconductor memory device according to claim 1, wherein
the memory cell array is a three-dimensional memory cell array provided in such a manner that the variable resistive elements are arranged in the row direction, the column direction, and a third direction perpendicular to the row direction and the column direction in the form of a three-dimensional matrix.

3. The nonvolatile semiconductor memory device according to claim 2, wherein
the three-dimensional memory cell array is provided in such a manner that
any one of the first and second electrodes has a laminated structure formed of a plurality of layers separated with an interlayer insulation film interposed therebetween,
a plurality of through holes penetrating the laminated structure are formed,
the other electrode of the first and second electrodes is formed so as to cover an inner peripheral wall surface of each of the through holes, and
the variable resistor and the insulation film both having an annular shape are interposed between the first and second electrodes to connect the first and second electrodes.

4. The nonvolatile semiconductor memory device according to claim 1, wherein
the insulation film is an oxide film of a metal functioning as the first electrode.

5. The nonvolatile semiconductor memory device according to claim 1, wherein
the metal oxide film functioning as the variable resistor includes a metal oxide having a perovskite structure.

6. The nonvolatile semiconductor memory device according to claim 5, wherein
the metal oxide film functioning as the variable resistor includes an oxide having a perovskite structure expressed by any one general formula $0 \leq X \leq 1, 0 \leq Z < 1$) among $Pr_{1-X}Ca_X[Mn_{1-Z}M_Z]O_3$, wherein M is an element selected from Ta, Ti, Cu, Cr, Co, Fe, Ni, and Ga, $Sm_{1-X}Ca_XMnO_3$, $La_{1-X}AE_XMnO_3$, wherein AE is divalent alkali earth metal selected from Ca, Sr, Pb, and Ba, $RE_{1-X}Sr_XMnO_3$, wherein RE is trivalent rare earth element selected from Sm, La, Pr, Nd, Gd, and Dy, $La_{1-X}Co_X[Mn_{1-Z}Co_Z]O_3$, $Gd_{1-X}Ca_XMnO_3$, and $Nd_{1-X}Gd_XMnO_3$.

7. The nonvolatile semiconductor memory device according to claim 1, wherein
a thickness of the oxygen depletion layer is 2 nm or more when the variable resistive element is in the high resistance state.

8. The nonvolatile semiconductor memory device according to claim 1, wherein
the second electrode is a metal oxide film functioning as the variable resistor, and its oxygen concentration is fixed.

9. The nonvolatile semiconductor memory device according to claim 1, wherein among
a first erasing means for selecting the plurality of variable resistive elements belonging to one or more columns, or the plurality of variable resistive elements belonging to one or more rows, and simultaneously applying the voltage of the first threshold value or more across the first and second electrodes in the forward direction of the rectifier junction to shift the resistance characteristics of the variable resistive elements to the low resistance state,
a first programming means for simultaneously applying the voltage of the second threshold value or more to the variable resistive element to be changed to the high resistance state, and a voltage less than the second threshold value to the variable resistive element to be kept in the low resistance state, in the reverse direction of the rectifier junction, across the first and second electrodes, among the plurality of variable resistive elements belonging to one selected row or one selected column,
a second erasing means for selecting the plurality of variable resistive elements belonging to one or more columns, or the plurality of variable resistive elements belonging to one or more rows, and simultaneously applying the voltage of the second threshold value or more across the first and second electrodes in the reverse direction of the rectifier junction to shift the resistance characteristics of the variable resistive elements to the high resistance state, and
a second programming means for simultaneously applying the voltage of the first threshold value or more to the variable resistive element to be changed to the low resistance state, and a voltage less than the first threshold value to the variable resistive element to be kept in the high resistance state in the forward direction of the rectifier junction, across the first and second electrodes, among the plurality of variable resistive elements belonging to one selected row or one selected column,
at least one of combination of the first erasing means and the first programming means, and combination of the second erasing means and the second programming means is provided.

10. The nonvolatile semiconductor memory device according to claim 9, wherein the memory cell array is divided into at least two memory regions, in a first memory region, the resistance state of the variable resistive element is written by the combination of the first erasing means and the first programming means, and in a second memory region, the resistance state of the variable resistive element is written by the combination of the second erasing means and the second programming means.

11. The nonvolatile semiconductor memory device according to claim 10, wherein the first memory region is used as a data storage region, and the second memory region is used as a program storage region.

* * * * *

UNITED STATES PATENT AND TRADEMARK OFFICE
CERTIFICATE OF CORRECTION

PATENT NO. : 8,432,720 B2  
APPLICATION NO. : 13/165941  
DATED : April 30, 2013  
INVENTOR(S) : Awaya et al.

Page 1 of 1

It is certified that error appears in the above-identified patent and that said Letters Patent is hereby corrected as shown below:

On the Title page, change "(73)   Assignee:  Sharp Kabushiki Kaisha, Osaka (JP)" to --(73) Assignees: Sharp Kabushiki Kaisha, Osaka (JP)  
          National Institute of Advanced Industrial Science and Technology, Tokyo (JP)--

Signed and Sealed this  
Twenty-fourth Day of September, 2013

Teresa Stanek Rea  
*Deputy Director of the United States Patent and Trademark Office*